United States Patent
Ashar et al.

(10) Patent No.: US 6,816,825 B1
(45) Date of Patent: Nov. 9, 2004

(54) SIMULATION VECTOR GENERATION FROM HDL DESCRIPTIONS FOR OBSERVABILITY-ENHANCED STATEMENT COVERAGE

(75) Inventors: Pranav Ashar, Princeton, NJ (US); Srinivas Devadas, Lexington, MA (US); Farzan Fallah, San Jose, CA (US)

(73) Assignees: NEC Corporation, Tokyo (JP); Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/335,755

(22) Filed: Jun. 18, 1999

(51) Int. Cl.$^7$ .......................... G06F 17/50; G06F 9/45; G01R 27/28
(52) U.S. Cl. ................. 703/14; 703/15; 716/5; 324/650; 714/33; 714/37
(58) Field of Search .................. 703/14, 15; 716/5; 324/650; 714/33, 37

(56) References Cited

U.S. PATENT DOCUMENTS

| | | | | |
|---|---|---|---|---|
| 5,748,497 A | * | 5/1998 | Scott et al. | 702/181 |
| 5,862,149 A | * | 1/1999 | Carpenter et al. | 714/726 |
| 5,870,308 A | * | 2/1999 | Dangelo et al. | 716/18 |
| 6,141,630 A | * | 10/2000 | McNamara et al. | 703/14 |
| 6,256,770 B1 | * | 7/2001 | Pierce et al. | 716/18 |
| 6,324,673 B1 | * | 11/2001 | Luo et al. | 324/758 |

OTHER PUBLICATIONS

Devadas, S., A. Ghosh, and K. Keutzer, "An Observability-Based Code Coverage Metric for Functional Simulation". Proc. of the 1996 IEEE/ACM Int'l Conf. on CAD (ICCAD '96). 1996. pp. 418–425.*

Cohen, J. "Constraint Logic Programming Languages". Communications of the ACM. Jul. 1990. vol. 33, Issue 7. pp. 52–68.*

(List continued on next page.)

*Primary Examiner*—Kevin J. Teska
*Assistant Examiner*—Ayal Sharon
(74) *Attorney, Agent, or Firm*—Sughrue Mion, PLLC

(57) ABSTRACT

A method of automatically generating vector sequences for an observability based coverage metric supports design validation. A design validation method for Register Transfer Level (RTL) circuits includes the generation of a tag list. Each tag in the tag list models an error at a location in HDL code at which a variable is assigned a value. Interacting linear and Boolean constraints are generated for the tag, and the set of constraints is solved using an HSAT solver to provide a vector that covers the tag. For each generated vector, tag simulation is performed to determine which others of the tags in the tag list are also covered by that vector. Vectors are generated until all tags have been covered, if possible within predetermined time constraints, thus automatically providing a set of vectors which will propagate errors in the HDL code to an observable output. Performance of the design validation method is enhanced through various heuristics involving path selection and tag magnitude maximization.

45 Claims, 13 Drawing Sheets

OTHER PUBLICATIONS

Al–Assad, H. "Design Verification Via Simulation and Automatic Test Pattern Generation". Proc. of the 1995 IEEE/ACM Int'l Conf. on CAD. 1995. pp. 174–180.*

Fallah, F., "Coverage Directed Validation of Hardware Models". Slides. Dated Dec. 14, 1998. http://glenfiddich.lcs.mit.edu/~farzan/occom_gen_slides/index.htm.*

Fallah, F., Ashar, P., and Devadas, S. "Simulation Vector Generation from HDL Descriptions for Observability–Enhanced Statement Coverage". Jun. 21–25, 1999, 1999 Design Automation Conference Proceedings.*

Fallah, F. "Coverage–Directed Validation of Hardware Models". Dissertation. Submitted Mar. 31, 1999. Copyright Jun., 1999. http://caa.lcs.mit.edu/~farzan/thesis.ps.*

"Welcome to 1998 Proceedings of Design Automation Conference". Copyright 1998. http://jamaica.ee.pitt.edu/Archives/ProceedingArchives/Dac/Dac98/.*

"Farzan Fallah's Homepage", printed Aug. 20, 2002. http://www.caa.lcs.mit.edu/~farzan/.*

R. C. Ho, C. H. Yang, M. A. Horowitz, and D. L. Dill, "Architecture Validation for Processors," in *Proceedings of the 22nd Annual Symposium on Computer Architecture*, Jun. 1995.

K.–T. Cheng and A. S. Krishnakumar, "Automatic Functional Test Generation Using the Extended Finite State Machine Model," in *Proceedings of the $30^{th}$ Design Automation Conference*, pp. 86–91, Jun. 1993.

S. Devadas, A. Ghosh, and K. Keutzer, "An Observability–Based Code Coverage Metric for Functional Simulation," in *Proceedings of the International Conference on Computer–Aided Design*, pp. 418–425, Nov. 1996.

F. Fallah, S. Devadas, and K. Keutzer, "OCCOM: Efficient Computation of Observability–Based Code Coverage Metrics for Functional Simulation," in *Proceedings of the $35^{th}$ Design Automation Conference*, pp. 152–157, Jun. 1998.

F. Fallah, S. Devadas, and K. Keutzer, "Functional Test Generation Using Linear Programming and 3–Satisfiability," in *Proceedings of the $35^{th}$ Design Automation Conference*, pp. 528–533, Jun. 1998.

T. Larrabee, "Test Pattern Generation Using Boolean Satisfiability," *IEEE Transactions on Computer–Aided Design*, vol. 11, pp. 4–15, Jan. 1992.

R. K. Brayton and others, "VIS: A System for Verification and Synthesis," in *Proc. Computer–Aided Verification*, vol. 1102, pp. 428–432, Jun. 1996.

* cited by examiner

SIMULATION VECTOR GENERATION FROM HDL DESCRIPTIONS FOR OBSERVABILITY-ENHANCED STATEMENT COVERAGE

BACKGROUND OF THE INVENTION

This invention relates to the automatic generation of vector sequences for the validation of circuit design. In particular, the vector sequences generated are used as inputs to a circuit under simulation to determine whether the desired outputs are produced. More particularly, the invention is embodied in a system, a method, and a program product for the automatic generation of vector sequences for the validation of circuit design, in a manner that targets an observability based coverage metric.

The following papers provide useful background information on the indicated topics, all of which relate to this invention, and are incorporated herein by reference:

A finite state machine (FSM) implementation model:
   R. C. Ho, C. H. Yang, M. A. Horowitz, and D. L. Dill, "Architecture Validation for Processors," in *Proceedings of the 22nd Annual Symposium on Computer Architecture,* June 1995.

Statement Coverage in HDL Code:
   K.-T. Cheng and A. S. Krishnakumar, "Automatic Functional Test Generation Using the Extended Finite State Machine Model," in *Proceedings of the 30th Design Automation Conference,* pp. 86–91, June 1993.

Observability-based statement coverage metric:
   S. Devadas, A. Ghosh, and K. Keutzer, "An Observability-Based Code Coverage Metric for Functional Simulation," in *Proceedings of the International Conference on Computer-Aided Design,* pp. 418–425, November 1996.

Evaluation Procedure for Observability-Based Statement Coverage Metric:
   F. Fallah, S. Devadas, and K. Keutzer, "OCCOM: Efficient Computation of Observability-Based Code Coverage Metrics for Functional Simulation," in *Proceedings of the 35th Design Automation Conference,* pp. 152–157, June 1998.

Recent Algorithms for Solving Hybrid-Satisfiability (HSAT) Problems:
   F. Fallah, S. Devadas, and K. Keutzer, "Functional Test Generation Using Linear Programming and 3-Satisfiability," in *Proceedings of the 35th Design Automation Conference,* pp. 528–533, June 1998.

Application of SAT Algorithms in CAD:
   T. Larrabee, "Test Pattern Generation Using Boolean Satisfiability," *IEEE Transactions on Computer-Aided Design,* vol. 11, pp. 4–15, January 1992.

Verilog:
   D. E. Thomas and P. R. Moorby, *The Verilog Hardware Description Language.* Kiuwer Academic Publishers, Boston, Mass., second ed., 1994.

Vis verification system:
   R. K. Brayton and others, "VIS: A System for Verification and Synthesis," in *Proc. Computer-Aided Verification,* vol. 1102, pp. 428–432, June 1996.

There will now be provided a discussion of various topics to provide a proper foundation for understanding the invention.

Digital Computers

Digital computers have made possible many changes in the scientific, industrial, and commercial arenas. Today, many businesses cannot function without the aid of working information systems. Many special-purpose and general-purpose computers are well-known.

A block diagram of a simple general-purpose digital computer is shown in FIG. 1, although the drawing figure could also pertain equally well to a special-purpose digital computer, depending on the functionality provided. Reference numeral 10 indicates the general-purpose digital computer. Such a computer may include a central processing unit 100, also referred to as a CPU. The main memory 110 may be understood to be a RAM. The computer in this a simplified diagram has only one I/O processor 120. The I/O processor 120 controls I/O devices 130. The I/O devices 130 include a display, a keyboard, a printer, a disk drive, and a mouse. It will be understood that this diagram is for explanatory purposes only, and is not intended in any way to limit the invention.

The CPU 100 includes a control unit, an ALU, and registers. The control unit is responsible for fetching instructions from main memory 110 and determining their type. The ALU performs operations, such as ed. and Boolean AND, needed to carry out the instructions. The registers of the CPU 100 provide a small, high-speed memory used to store temporary results and certain control information. The registers may each be designated a certain function, or may be general-purpose registers. Included in the registers is a program counter PC, which points to the next instruction to be executed. There is also an instruction register IR, which holds the instruction currently being executed.

It will be appreciated that the CPU 100, the main memory 110, and the I/O processor 120 are interconnected by buses. Communications between these different units takes place across the buses.

Thus, it can be seen that a digital computer is an interconnection of digital modules. There are modules within the CPU 100, and be CPU, the main memory 110, and the I/O processor 120 also may be thought of as modules themselves. On a larger scale, when these complements are all included in the same container, this container may be understood to be a module, and the different I/O devices (such as display and keyboard) may be understood to be modules themselves.

Miniaturization

The miniaturization of digital computers is a useful and exciting phenomenon. A CPU enclosed in a small integrated circuit package is referred to as a microprocessor. A microprocessor is just one example of the miniaturization of digital components. When a circuit or a combination of related circuits is miniaturized and produced on a single chip, such a chip may be called an integrated circuit.

Special production techniques are required to produce an integrated circuit. Such production techniques add greatly to the cost of the final product.

In view of the expense of producing a microprocessor, is very important to ensure that there are no errors in the design that would render the microprocessor unusable. Modern, high-performance microprocessors are extremely complex, however, and require substantial validation efforts to ensure functional correctness. Modern microprocessors contain many architectural features designed to improve performance, including branch prediction, speculative execution, lockup free caches, dynamic scheduling, superscalar execution, and the like. Such features and complexity to a microprocessor, because they constitute modules within the CPU which interact with each other.

As a matter of economics, the great expense of producing a miniaturized microprocessor and then testing it makes it impractical to verify the design on an actual prototype of the microprocessor. Instead of testing an actual microprocessor produced according to a given design, the design is tested by simulating the operation of the microprocessor on a computer.

Simulation

To simulate the operation of a physical machine, such as a microprocessor, in a digital computer, it is necessary to represent the functionality of the microprocessor in some manner. One of the ways to represent the functionality of a microprocessor in a form usable by a computer is with the hardware description language HDL. In particular, the desired microprocessor is modeled using HDL. The HDL model describes the interconnections of the arithmetic, logic, and memory modules included in a microprocessor.

An HDL model of a microprocessor is comprised of statements in the hardware description language HDL.

There are computer applications available which will accept, as input, an HDL model of a microprocessor. Based on this input HDL model, the computer application will simulate different aspects of the operation of the microprocessor. The precise aspects of this operation to be simulated may be controlled by the person using the computer application.

It will be appreciated, that the operation of the microprocessor (that is, the microprocessor being simulated) cannot be tested without some inputs being provided to the simulated microprocessor. When the simulated microprocessor is provided with inputs, it will respond in certain predefined ways, providing the design is correct. Such a series of inputs may be referred to as a simulation vector (or, for linguistic convenience, simply as a vector). As used herein, "vector" and "vector sequence" will generally be used interchangeably.

Today, the most common approach to checking the correctness of the design is to verify that the description of the design in some hardware description language, such as HDL, provides the proper behavior as elicited by a series of simulation vectors.

Simulation is by far the primary design validation methodology in integrated circuit (IC) design and it is likely to remain so for the foreseeable future, especially in the validation of circuits at the Register Transfer Level (RTL, also referred to as RTL circuits). A reason for this is that the typical RTL circuit is derived from a heterogeneous, ad hoc description of the behavior, i.e. there is no formal model against which to compare the behavior of the RTL. In fact, even if there were such a formal model, today's available verification tools are generally not robust enough to perform an automatic, formal comparison of the RTL against the behavioral model. That leaves some form of simulation as the only alternative to compare the input/output (I/O) response of the RTL against the desired I/O response represented in the specification.

One way to simulate the I/O response of a circuit is through the use of vectors. As already mentioned, a vector may be understood to be a sequence of inputs. Another way to view a vector is as a sequence of assignments of values to input variables defined in the HDL model of a circuit.

When a vector is introduced as an input to a circuit being simulated, the output of the circuit may be observed and compared against the desired output response from the specification. To simulate all the behaviors of a circuit, it is not unusual for many vectors to be used.

FIG. 2 shows a conceptual view of a circuit design to be tested. Reference numeral 20 indicates this circuit which will be simulated on a general purpose or a special-purpose computer, such as that shown in FIG. 1. In FIG. 2, reference numeral 150 indicates the inputs to the circuit. Reference numeral 160 indicates the outputs that the circuit will provide. Reference numeral 170 indicates registers of the circuit. It will be appreciated that each input of the circuit may be represented by a variable within the statements of the HDL code. Similarly, each output of the circuit may also be a variable in a statement of HDL code. The same may be said of the registers.

In the highly schematic representation shown in FIG. 2, intermediate variable assignments are not represented; such intermediate assignments are not visible to the outside world until they show up as an output 160.

It is to be understood that, during the simulation of the circuit shown in FIG. 2, a simulation program is active in the main memory 110 of the general purpose computer 10. The simulation program accesses the HDL code which comprises the HDL model of the circuit. The HDL code may be contained in a file and stored on an I/O device 130 such as a disk drive. The simulation program in the main memory 110 is executed in a well-known fashion by the CPU 100 so as to simulate the operation of the circuit described by the HDL model.

A series of vectors may also be provided in a file stored on a medium such as a disk drive. The simulation program may access the vectors and use them to determine what particular sequence of assignments should be made to the inputs 150 of the circuit 20 being simulated. The results of applying the vectors to the circuit 20 being tested may be written by the simulation program to an output file or the like. Such an output file could include information such as the values appearing at each of the outputs 160 after certain steps or at a given time.

Since the desired functionality of the circuit 20 being simulated is known beforehand, the expected results of operating the circuit vis-a-vis the inputs 150 determined by the series of vectors also are known beforehand. When the simulation results do not match the expected results (and assuming that the expected results are correctly determined by the designer), there is an error in the design.

The foregoing sequence of events is generally shown in FIG. 3, in which reference numeral 180 indicates the HDL code comprising the model of the circuit 20 to be simulated. Reference numeral 190 indicates a file or the like of input vectors which will be used at the inputs 150 of the circuit 20. The HDL code 180 and the input vectors 190 are taken as input by a general purpose or special-purpose computer 10. The computer 10 simulates the functions of the circuit 20 defined by HDL code 180 in response to the input vectors 190 and may produce results 200. The results 200 may be stored in a file, displayed on a display, sent to a printer, etc.

The Creation of Vectors for Testing

Simulation may be the most time-consuming task in the design of integrated circuits. Simulation time clearly influences the time to market. A major task of simulation is the preparation (or generation) of vectors. Vector generation is typically done manually by verification engineers based on a study of the HDL code 180 that defines the design of a circuit to be simulated. Vector generation time, and the actual simulation time using the vectors, both contribute to the time spent in validating the design. Clearly, there will always be some need for the manual generation of certain simulation vectors to check certain special functions.

To aid in the generation of vectors, various automated approaches have been taken. An automated approach to generating vectors is typically related to a coverage metric. A coverage metric may focus on generating vectors that cover HDL code paths, HDL code lines, transitions of a finite state machine (FSM) model, or the like. The choice of one or more coverage metrics influences the computational requirements of automatic vector generation, and the size of the generated vector set, and ultimately the time it takes to simulate the generated vectors.

In the automatic generation of vectors, one goal is to develop in designers a confidence that the vectors generated using the one or more coverage metrics detect a significant number of errors. By so doing, a reduction could be made in the level of effort directed toward the manual generation of vectors. What is needed is an automatic way to generate the majority of vectors now manually produced by verification engineers. This would result in a significant reduction in design turnaround time.

Since the choice of coverage metrics is so influential in the amount of computational effort expended and the size of the set of vectors, a key issue is what constitutes a reasonable suite of coverage metrics.

In order to detect an error, simulation must visit the site of the error, and subsequently propagate the effect of the error to an observable output.

A coverage metric must begin with some error model and impose observability and controllability constraints on the simulation to be useful. An additional requirement is efficient evaluation of the coverage metric, if it is to be used in the inner loop of vector generation. The complete coverage of all paths in the HDL code 180 or the coverage of all transitions in a finite state machine (FSM) model of the implementation results in too many vectors to be usable. Approaches that generate vectors to cover only selected transitions in the FSM model or only selected paths in the HDL code 180 are much more practical. Coverage of all statements in the HDL code 180 is more tractable than path or transition coverage, but again not very meaningful since it does not address the observability requirement.

A First Observability Based Approach

Recent useful work has been done in the development of an observability based code coverage metric, as will now be described. For linguistic convenience, the material that follows may be referred to as a first observability based approach. This first observability based approach is reported in an article by S. Devadas, A. Ghosh, and K. Keutzer, "An Observability-Based Code Coverage Metric for Functional Simulation," in *Proceedings of the International Conference on Computer-Aided Design*, pp. 418–425, November 1996.

It will be appreciated that, when attempting to make sure that each statement in the HDL model of a circuit is covered by the input vectors, it should be kept in mind that mere coverage is not enough. For example, assume that the input vectors 190 stimulate a bug (i.e., a design error) and that the bug is associated with a certain one of the statements making up the HDL model. It might be the case that the certain statement corresponding to the activated design error assigns the erroneous value to a variable. Subsequently, the variable is provided as one of the two inputs to a Boolean AND operation or the other of the two inputs is always 0. In such a case, even though there is a design flaw, it will be impossible to observe any impact of this error in one of the outputs 160 of the circuit 20.

In other words, the fact that a statement with a bug has been activated by input stimuli does not mean that the observed outputs of the circuit simulated by the simulation program will be incorrect.

The problem of verifying the correctness of an HDL description of circuit behavior is similar to the software testing problem because the description of circuit behavior is similar to a program written in some high-level programming language like C or C++.

To explain certain terms, a discussion of control flowgraphs and path testing will now be provided.

A control flowgraph is a graphical representation of a program's control structure. A control flowgraph includes processes, decisions, and junctions. A process is a sequence of program statements uninterrupted by either decisions or junctions. A process has one entry and one exit. A decision is a program point at which the control flow can diverge. A junction is a point in the program where the control flow can merge. An example of a control flowgraph for simple program is shown in FIG. 4. A process is shown as a rectangle, a decision is a diamond, and a junction is a circle.

A path in the control flowgraph is a sequence of processes that starts at an entry, junction, or decision and ends at another, or possibly the same junction, decision, or exit.

Given a set of program stimuli, one can determine the statements activated by the stimuli (i.e. vector) by applying the stimuli to the control flowgraph. A line coverage metric measures the number of times every process (and therefore constituent statements) is exercised by the program stimuli. In the case of branch coverage, the number of times each branch is taken under the set of vectors is measured. Path coverage measures the number of times every path in the control flowgraph is exercised by the vectors. The goal of software testing is to have 100% path coverage, which implies branch and line coverage. However, 100% path coverage is a very stringent requirement and the number of paths in a program may be exponentially related to the program size.

Other coverage metrics are also known, for example, multi-condition coverage, loop coverage, and relational operator coverage.

Such coverage metrics require activation but do not relate to the observability conditions required to see the effect of possible errors in the activated statements. For example, in the control flowgraph shown in FIG. 4 an error in the computation of V never propagates to the LOOP if Z is greater than or equal to 0. The path coverage metric will satisfy observability requirements if paths from program inputs to program outputs are exercised and the values of variables are such that the erroneous value is not masked. However, the simple path coverage metric does not explicitly evaluate whether the effect of an error is observable at an output.

In software testing (as opposed to simulating a circuit modeled in HDL code), the problem of observing the effect of an activated and possibly erroneous statement is deferred until test implementation. In test implementation of software, additional testing code is added to points in the program which are hard to force to particular values (i.e., added controllability is provided), and at those points where information is lost (i.e., added observability is provided).

One problem with these internal test drivers is that variable values may not be easily translatable into useful data that the programmer can understand and check against the specification.

Modeling Observability Requirements in a Coverage Metric

To model observability requirements, it is necessary to determine whether paths from inputs to outputs are sensitizable, i.e., whether effects of errors can be propagated through paths. To check the sensitizability of a path, tags are used. Tags will be described more below.

Given a set of input vectors to an HDL model, the output response can be determined using a simulator. It is important to note here, that the generation of vectors is not being discussed—only the determination of coverage when the vectors are given. An enhanced simulator can be used to propagate tags from inputs to observable outputs. To deterministically propagate tags through a circuit being simulated, certain assumptions are made. These assumptions do not require assigning particular binary values to the tag, except in the case of tags on single binary variables.

In using tags, it is useful to view a circuit as computing a function, and to view the computation as a series of assignments to variables. Errors in computation are therefore modeled as errors in the assignments, i.e., any value assigned to any variable in the behavioral or RTL description may possibly be in error.

The possibility of an error may be represented by tagging the variable (on the left-hand side of an assignment statement) by a symbol such as $\Delta$ which signifies a possible change in the value of the variable due to an error. Both positive and negative tags may be considered, with a positive tag written simply as $\Delta$, and a negative tag written as $-\Delta$.

Positive and negative tags may be introduced on every assignment statement in the HDL description 180 of a circuit 20. The circuit 20 is simulated for each of the vectors included in the input vectors 190 to determine which of the tags are both activated (by the activation of the corresponding assignment statement) and also propagated to the outputs of the circuit 20. When a tag is propagated to an output, it means that there is a path from the point where the tag was introduced to the output, and that the path was activated by the vector or vectors. During such simulation, the effect of each tag may be separately considered. It is possible, however, to use a simulator to simulate the effects of several tags in parallel as in parallel fault simulation.

The use of tags is an attempt to detect the bugs in the code (i.e., the HDL model) that may result in an incorrect value of some HDL variable. Not all bugs, however, necessarily result in an incorrect value of some HDL variable. Bugs that are errors of omission, or global incorrect assumptions regarding program or algorithm behavior might not cause an incorrect value of an HDL variable. Tags are useful in fulfilling the two basic requirements in verifying an HDL model, namely, activating statements in the code and observing the effect of activation at an output.

For a value at an input 150 to be propagated through a circuit under simulation 20, the other inputs must be at non-controlling values. As mentioned above, if a Boolean AND gate has a 0 input, no value on the other input will propagate to the output since 0 is a controlling value for the Boolean AND gate. In a multiplier, a 0 at one of the inputs will block propagation of any value on the other input.

If there is an error in some assignment, the magnitude of the error determines whether the error will be propagated or not. As an example, consider the following expression:

$$f = a + b > c$$

In this example, variables a, b, and c are four-bit integers. The vector input to the circuit 20 is represented by:

$$S = (a=3, b=4, c=5)$$

A positive error on a (i.e., $a+\Delta$) is not propagated to f, since the comparison on the right hand side of the assignment statement provides the same value of 1 for f. That is, any positive value for $\Delta$ will have no effect on the comparison of whether $(3+\Delta)+4$ is greater than 5. A negative error might be propagated to f resulting in an erroneous value of 0 when the inequality on the right side of the assignment is evaluated. This erroneous value resulting from the comparison on the right side of the assignment will occur if the magnitude of the error is greater than or equal to 2 (i.e., if the negative $\Delta$ reduces a from its original value of 3 down to 1, making a+b now equal 5, which is not greater than c which has a value of 5).

Thus, the detection of an error in an assignment depends on the magnitude and the sign of the error. Positive and negative tags may be used to model the sign of the errors. However, the magnitude issue results in a dilemma. If a tag has magnitude as a parameter, the number of possible tags is greatly increased. Also, tags having magnitude may be too closely related to particular design errors which may or may not occur.

A useful approach is to make the assumption that the error will be of the right magnitude or magnitudes to propagate through circuit 20. As mentioned above, positive and negative tags model the sign of an error in relation to the value of a variable. In the observability based coverage metric, it may be assumed that the tag introduced in an assignment statement (i.e., the change in the value of the variable on the left-hand side of the assignment) corresponds to an error of appropriate magnitude such that it will propagate through any module provided (a) it is of the appropriate sign and (b) the other inputs to the module are non-controlling (i.e., they do not block propagation).

Functional simulation and statement coverage will now be discussed. Again, it is important to keep in mind that the present discussion relates to a way of determining how many HDL statements are covered, given a known set of input vectors, under an observability based coverage metric.

Tag simulation may be carried out on a given HDL circuit description in exactly the same manner as functional simulation. A functional simulator such as the VERILOG simulator executes initialization statements, and propagates values from the inputs of a circuit to the outputs. It keeps track of time, causing the change to values to appear at specified times in the future. When the simulator has no further statements to execute at any given time instant, it finds the next time-ordered event from the event queue, updates time to that of the event, and executes the event. This simulation loop continues until there are no more events to be simulated or the user terminates the simulation.

Some functional simulators have features that allow the user to determine the execution counts of every module/statement in the HDL description, when the description is simulated with a functional vector set. This allows the user to detect possibly unreachable statements and redundant conditional clauses. The tag simulation method augments this coverage.

The HDL circuit description is pre-processed to extract a flowgraph of the circuit. The flowgraph shown in FIG. 4 does not model concurrency; the HDL model may have interacting concurrent processes. A fork may be added to the flowgraph to allow the modeling of parallelism. An example of a flowgraph with fork nodes is shown in FIG. 5.

It will be appreciated that the flowgraph is not used to perform simulation. Rather, it is used in determining whether a tag can be propagated to an output 160.

Tag Injection

In the observability-based coverage metric, assignment statements consisting of arithmetic operations, Boolean word operations, and Boolean operations are considered. Positive and negative tags are injected at every assignment statement and attached to the variables on the left-hand side of the assignment.

If a variable is a collection of bits, it is treated as a single entity. However, if the variable is defined as a collection of bits, but individual ones of those bits are sometimes manipulated, the individual bits are treated as Boolean variables throughout. An IF statement has a control condition which is a Boolean variable. If this Boolean variable is computed, i.e., it is not a primary input, it appears as the left-hand side of some assignment. The tag that is injected for that assignment models errors in the control flow. In such a situation, errors might result in the THEN branch being taken rather than the ELSE branch, or vice versa. No tags are injected for control constructs, though tags must be propagated based on the control flow.

Every assignment statement executed during simulation of functional vectors is also "tag simulated" to determine which tags are propagated. Tags attached to variables on the right hand side of the assignment are propagated and attached to the left-hand side according to a tag calculus used in the observability-based coverage metric.

Tag Calculus

In the case of strictly Boolean variables, this calculus is equivalent to the D-calculus. For ease of exposition, the propagation of a single tag during simulation will be discussed. In actual implementation, several tags may be injected and propagated in parallel.

First, the tag calculus for Boolean logic gates will be discussed. The calculus for a two-input AND gate and an inverter are shown in the following table.

| AND | 0 | 1 | $0+\Delta$ | $1-\Delta$ | INVERT |
|---|---|---|---|---|---|
| 0 | 0 | 0 | 0 | 0 | 1 |
| 1 | 0 | 1 | $0+\Delta$ | $1-\Delta$ | 0 |
| $0+\Delta$ | 0 | $0+\Delta$ | $0+\Delta$ | 0 | $1-\Delta$ |
| $1-\Delta$ | 0 | $1-\Delta$ | 0 | $1-\Delta$ | $0+\Delta$ |

The four possible values at each input are $\{0, 1, 0+\Delta, 1-\Delta\}$. Note that $0-\Delta$ is treated similar to 0, and $1+\Delta$ is treated much like 1. The entries in the table are self-explanatory. Using this calculus, any collection of Boolean gates comprising a combination logic module can be tag simulated.

Tag propagation through arithmetic operators will now be discussed. This discussion will also include Boolean word operators.

All modules in the circuit being simulated are assumed to be n bits wide. In the following equation, v(f) is a variable on the left side of an assignment statement, and v(a) and v(b) are variables on the right side of an assignment statement. The two variables on the right side of the assignment statement are separated by at least one operator op. For each operator op, after the simulator computes v(f)=v(a)(op)v(b), the variable on the left-hand side of the assignment statement (i.e., v(f), is tagged with a positive or negative $\Delta$. The tag variable may be written as:

$$v(f)+\Delta \text{ or } v(f)-\Delta$$

Tag Propagation Rules for Different Modules

First, an adder module is considered. If all tags on the adder inputs are positive, and if the value v(f)<MAXINT, the adder output is assigned $v(f)+\Delta$. It should be noted that MAXINT is the maximum value possible for f. Similarly, if all tags are negative, the adder output is assigned $v(f)-\Delta$. If both positive and negative tags exist at the inputs of an adder, the output is assumed to be tag-free.

Next, a multiplier module is considered. All tags have to be of the same sign for propagation. A positive $\Delta$ on input a is propagated to the output f provided $v(b)\neq 0$ or if b has a positive $\Delta$. In such a case, the multiplier output is assigned $v(f)+\Delta$. Likewise, a negative $\Delta$ on input a is propagated to the output f provided that $v(b)\neq 0$ or b has a negative $\Delta$. In such a case, the multiplier output is assigned $v(f)-\Delta$.

Next, the greater-than (i.e., ">") comparator will be discussed. If tags exist on inputs a and b, they have to be of opposite signs, else the tag is not propagated to the output. Assume a positive tag on a alone, or a positive tag on a and a negative tag on b. If $v(a) \leq v(b)$ then the tag (or tags) gets propagated to the output. Otherwise, no tag propagation occurs. The comparator output is assigned $0+\Delta$. Other tags and other kinds of comparators are handled similarly.

For a bitwise AND, all tags have to be of the same sign for propagation to occur. Given a positive tag on a and a tag-free b, if at least one of the bits in b is not 0, and $v(a) \neq 2^n-1$ and $v(b) \neq 2^n-1$, then v(f)=v(a) & v(b) is computed and assigned the output $v(f)+\Delta$. Negative tags are handled in a similar fashion.

For a bitwise NOT: $v(f)_i = \overline{v(a_i)}$ where $0 \leq i < n$. For a positive tag on a, the output is assigned $v(f)-\Delta$.

Tag Propagation through IF Statements

Propagation through IF statements requires pre-processing the program. The reachability of processes from decisions (IF statements) in the control flowgraph is determined. Since each process has a single entry and a single exit, all the statements within each process will have the same reachability properties.

It is assumed, without loss of generality, that each decision is binary. For each decision, the set of all processes that can be reached when the control condition c is true, namely $P_c$, is determined, and also the set that can be reached if the control condition is false, namely $P_{\bar{c}}$.

When an IF statement is encountered by the simulator, there are two cases:
1. There is no tag in the control condition. In this case simulation proceeds normally. In the appropriate processes, statements are executed and tags (if any) are propagated/injected.
2. If a tag is attached to the control condition c (which is a Boolean variable), it means that the tag will result in the incorrect branch being taken. Assume a positive tag on c (i.e., $c+\Delta$). If the value of c on the applied vector is 1, the tag is not propagated. However, if the value of c is 0, then all the assigned variables in the processes $P_{\bar{c}}-P_c$ are tagged. Under the tag condition these assignments will be missed, and hence the output variables are tagged. A positive tag is applied if the new value (after assignment) is less than the old value, a negative tag if the new value is greater than the old value, and no tag if both values are equal or if the old value is undefined. This assumes that equivalent statements in both clauses have been extracted out of the IF (placed before the decision). It should be noted that tags could also have been assigned to variables in $P_c$-$P_5$, because under the tag condition these assignments are wrongly made, but doing so would require multiple trajectory simulation which may be too expensive.

Tag Simulation

For each functional vector, or functional vector sequence, for every positive or negative tag injected on each assigned variable, the calculus just described in the previous section may be used to determine which of the tags is propagated to the output's of the circuit being simulated 20. The coverage for the functional vector set may be computed as the percentage of tags propagated to the outputs divided by the total number of tags.

Simulation proceeds on the HDL simulation model in an event-driven manner as already described. For each functional vector sequence, though the effect of each tag is considered separately, a parallel tag simulation may be performed or the propagation of multiple independent tags is determined. After each assignment statement is evaluated, it is determined whether the tags on the variables on the right hand side of the statements are propagated to the variable on the left-hand side. Tags are also injected for the assignment on the variable on the left-hand side. Some tags may not be activated by the functional test sequence if the statements in which the tag occurs is not reached.

After each vector in the sequence is simulated, the observable outputs of the HDL model are inspected to determine the tags propagated to the outputs. In the case of sequential machines, tags may propagate to the output only after multiple vectors have been applied.

In many cases a designer may be interested in exercising particular sequences of statements in the HDL model, and observing the effect at the output. Alternately, a designer may be interested in exercising particular modules in the given order and checking the output response. The tag simulation algorithm just mentioned can be extended to keep track of the subpath or subpaths that are activated in propagating the tag to the output. Information regarding the activated paths can be passed along with the coverage numbers.

A Second Observability Based Approach

The first observability based approach having been explained, the discussion will now turn to a second observability based approach which may understood to be an improvement upon the first, in certain respects. This second observability based approach is reported in an article by F. Fallah, S. Devadas, and K. Keutzer, "OCCOM: Efficient Computationa of Observability-Based Code Coverage Metrics for Functional Simulation," in *Proceedings of the 35$^{th}$ Design Automation Conference*, pp. 152–157, June 1998.

Under the second observability based approach, there is not only the above-identified effective observability-based statement coverage metric in its general sense, but also a fast companion procedure for evaluating it. Again, it is important to note that this second observability based approach is an approach to computing the coverage that is provided by a predetermined set of vectors, where coverage is evaluated based on an observability based metric.

The evaluation procedure is computationally very efficient, more so than the first approach.

In general, the improved evaluation procedure involves breaking up a computation into two phases: functional simulation of a modified HDL model, followed by analysis of a flowgraph extracted from the HDL model. Commercial HDL simulators can be directly used for the time-consuming first phase, and the second phase can be performed efficiently using concurrent evaluation techniques.

Phase 1, more particularly, involves an automatic modification of the given HDL model 180, adding new variables and moving statements out of conditionals, and simulating the given vectors using commercial HDL simulators. Thus, available simulation technology can directly be exploited. There is a loss of simulation efficiency due to the addition of new variables, but this is not very large. The modifications to the HDL model are necessary because of conditionals in the HDL model. Simulating the modified HDL model provides more information than simulating only the original model. This extra information is used in the second phase to perform tag propagation. Tags do not play a part in this first phase.

The simulation of the vectors is necessary also because the vectors are given. The intermediate values cannot be known until the vectors are simulated on the HDL model.

For phase 2, tag injection is performed and propagation is determined. A flowgraph is created from the modified HDL model, and the results of the simulation are used to determine coverage under the observability based criteria. Tag injection simply corresponds to introducing a tag on an edge in the graph (i.e., the flowgraph) and tag propagation corresponds to selectively cursing paths from the age to the output nodes. The efficiency in this phase comes from using concurrent evaluation techniques. The tag simulation calculus described above is not used in phase 1, but only in phase 2. Nevertheless, understanding the tag simulation calculus helps to understand why the modifications to the HDL are performed in this evaluation procedure.

Phase 1 Modification to HDL, in More Detail

Under the evaluation procedure being described, there is an automatic modification of the HDL model such that the HDL simulation produces enough information to compute coverage during phase 2. The modification is illustrated for several commonly occurring cases below. The modifications all require the addition of new variables.

A simple conditional will first be used as an example to show how the HDL code 180 is modified. The following code represents the original HDL:

```
if (cexp)
    x = expr1;
else
    x = expr2;
```

The modification to the original HDL code 180 results in the following:

```
x1 = expr1;
x2 = expr2;
if (cexp)
    x = x1;
else
    x = x2;
```

Consider the case of a tag on cexp (cexp may be understood to mean a conditional expression). During the simulation of the modified code, the values of both expr1 and expr2 are computed, and stored in the new variables x1 and x2. The old value of x is known, and the new values of x corresponding to the execution of both the THEN and ELSE clauses, regardless of the value of cexp. This will allow the correct propagation of positive or negative tags on cexp in phase 2.

Nested conditionals will now be considered. The case of nested conditionals is more complicated. Further, the situation where variables such as x are assigned values that depend on the old values (e.g., increment operation) must be considered. The original code is as follows:

```
if (cexp1) begin
    if (cexp2)
        x = expr1;
    if (cexp3)
        x = x + expr2;
end
```

The transformed code, which will compute the necessary information to perform propagation of tags on cexp1 or cexp2 is as follows:

```
x2 = x;
x1 + expr1;
if (cexp2)
    x2 = x1;
x3 = x2 + expr2;
if (cexp3)
    x2 = x3;
if (cexp1)
    x = x2;
```

The case of a simple loop will now be considered. The interesting case is where there is a tag on the variable N. The following is the original HDL code 180 including a simple loop:

```
for (i = 0; i < N; i++)
    x = x + expr;
```

The transformed code is as follows:

```
x1 + x;
for (i = 0; i < N + 1; i++)
    begin
        x1 = x1 + expr;
        if (i < N)
            x = x1;
    end
```

If there is a negative tag on N, then that corresponds to the situation that the loop is iterated fewer than N times. If there is a positive tag on N, then that corresponds to the situation or the loop is iterated more than N times. To minimize simulation overhead, exactly one more iteration of the loop is performed. Given the extra conditional in the modified loop, the two pieces of code result in the same value for x. However, x1 will contain the value for the case where the loop is iterated N+1 times.

Similar transformations can be made for WHILE and REPEAT loops.

Tags are not injected on the loop counter variable i. It is assumed that errors on i are reflected by changes in the number of loop iterations, i.e., N. Propagating tags on variables such as x does not require additional information.

Now the case of a conditional with an event will be considered. Events in Verilog correspond to setting variables that affect other processes. Consider the following original HDL code 180:

```
if (cexp)
    begin
        x = expr1;
        --> ec1;
        y = expr2;
    end
else
    x = expr3;
```

The following is the transformed HDL code 180:

```
x1 = expr1;
y1 = expr2;
x2 = expr3;
if (cexp)
    begin
        x = x1;
        --> ec1;
        y = y1;
    end
else
    x = x2;
```

This case is similar to the simple conditional case, where the concern is with a tag on cexp. The additional complication is the event ec1. The event should not be moved outside the THEN clause, because there is no way of undoing the effect of the event in the simulator, if the clause is not going to be executed.

Finally, a loop and a conditional will be considered. A loop inside a conditional is handled like any other statement. A conditional inside a loop requires a more complicated transformation. This is the original HDL code 180:

```
for (i = O; i < N; i++)
    if (cexp)
        x = x + expr1;
    else
        x = expr2;
```

The transformed HDL code 180 is as follows:

```
x3 = x;
for (i = O; i < N + 1; i++)
    begin
        x1 = x3 + expr1;
        x2 = expr2;
        if (cexp)
            x3 = x1;
        else
            x3 = x2;
        if (i < N)
            x = x3;
    end
```

It is desired to propagate tags on both iteration count variable N, and the conditional expression cexp in phase 2.

The code needs to be transformed such that there is enough information to propagate either tag.

Consider a tag on N, and no tag on cexp. This is similar to the simple loop case, except that values are being computed in both clauses of the conditional. The case of no tag on N and a tag on cexp is the same as the simple conditional case.

In a single tag model, it may be the case that a tag injected on a variable y is propagated to both N and cexp.

Phase 2—Tag Propagation

Given the information regarding variable values for the simulated functional vectors, it will now be described the manner in which concurrent tag propagation is performed. A flowgraph data structure that enables efficient tag propagation is used. Similarities between this second observability based approach and the first observability based approach described above will be noticed.

A graph is created from the HDL model. The graph may be represented as G(V,E,L(E)). Here, V indicates the set of all vertices, E indicates the set of voltages, and L(E) represents the labels of the edges of the flowgraph. Each vertex v∈V corresponds to a variable in the HDL model. Each edge e(v,w)∈E is a directed edge from source node v to destination node w. The edge implies a data dependence between the nodes. In other words, it may be said that node w depends on v.

The label of an edge l(e)∈L contains the information below:

Line number: the edge exists because of a data dependence. A particular line of the modified HDL file containing the description of the model is associated with the edge. For example, given a=b+c in a particular Line 154, the edges from b to a and c to a will both have Line 154 as a label.

Conditional expression: in order for a data dependency to exist, there is a conditional expression attest to be true. For example, given

```
if (x > y)
    a = b + c;
``` the conditional expression for the edge from b to a would be x>y. Since the nested conditionals have been removed from the modified HDL model, there is no need to conjunct multiple expressions. The expression will correspond to the conditional clause of a single IF statement in the original HDL model.

Indices for array variables: Arrays are common in HDL models. There will be a separate tag associated with each array element, resulting in an array of tags. Given:

*a*[*i*]=*b*[*i*+4];

there will be a single node for the array b and the array a, and an edge from b to a. Information corresponding to the array indices will be associated with the edge from b to a. In general, two indices are required, one for b and one for a. It is necessary to compute these indices dynamically during tag propagation.

Type of dependence: Dependence can be, normal, conditional, through task or function call, and through module instantiation. For example, given:

```
if (x > y)
    a = b+c;
``` there is an edge from x to a and from y to a. These edges are conditional edges. The edges from b and c to a are normal edges. A task or function call dependency is a dependency between inputs and outputs of a task enable or function call. If there is a tag on one of the inputs, or the tag-injected line is inside the task or function, there may be tags propagated to the output of the task or function.

Propagation multiplier: a multiplier is associated with each edge that will be used to multiply tags propagating down the edge. These multipliers may be expressions. For example, given a=b−c, the edge between b and a has a +1 multiplier, but the edge from c to a has a −1 multiplier. (This is because a positive tag on c should result in a negative tag on a). There is an additional complication for ages whose dependence type is conditional. Consider the following:

```
if (x > y)
    a + a1;
else
    a = a2;
```

In this case, the conditional dependence edge from x to a will have the expression a1−a2 as the propagation multiplier. Of interest is only the sign of a1−a2, not its magnitude.

A single observable vertex 0 is created in the graph, and does not correspond to any variable. The variables in each "display" or "monitor" statement in the HDL model will be connected to 0 via edges. Each edge will have a Line number corresponding to the display statement. The conditional expression will always be true, and the propagation multiplier will be +1 or −1. If array variables are displayed, the index of the variable will be attached as a label for the edge.

Concurrent tag propagation under the second observability based approach will now be described.

Tag propagation is performed on the graph structure, and uses information obtained from the simulation trace of the modified HDL model. For each vector, all tags they can be propagated to the observable vertex 0 are determined using con current tag propagation. The steps are:

1. Each edge in the graph is first determined to be active or inactive for the given vector. An active edge is an edge that can propagate a tag from a predecessor node to the successor node. Whether an edge is active or not depends on the tag simulation calculus described above. For example, given the statement C=A×B, if B is 0, then the edge from A to C will be inactive. A complication is that edges corresponding to the control statements may be active or inactive depending on the sign of the tag which is propagated, as well as the value of the control predicate under the given vector. For example, in:

```
if (y)
    x = exp1
else
    x = exp2;
``` there is an edge with conditional dependence from y to x. This edge is inactive if exp1−exp2=0 for the given vector, and is marked active otherwise. The propagation multiplier of the edge is +1 if expr1−expr2>0, and −1 if expr1−expr2<0. If y=1, then a positive tag on y cannot be propagated to x from y, but a negative tag can.

2. All inactive edges in the graph are deleted.

3. A positive and a negative tag are injected on the observable vertex 0.

4. Starting from the observable vertex 0, and assuming positive (negative) tags on the vertex, edges in the graph are traversed backwards, in the reverse order of simulation trace, determining all nodes n∈V that can reach the observable vertex. The vertex 0 is reachable from node n, if, before traversing any of n's fanin edges, all traversed paths from n to 0 have propagation multipliers of the same sign (the propagation multiplier of a path is simply the product of the propagation multipliers of the constituent edges). Note that paths with multipliers of different signs might result in tag cancellation, and under this second observability based approach it is assumed that the tag is not propagated.

5. Line numbers of edges encountered during the backward traverse determine the tags which are observable in vertex 0.

In the above identified second observability based approach, there is provided and efficient method to compute the coverage under an observability based code coverage metric for a given set of vectors on complex HDL designs. This method offers a more accurate assessment of design verification coverage than line coverage. This second observability based approach also is more computationally efficient than the first observability based approach because it breaks up the computation into two phases: functional simulation of the vectors on a modified HDL model, followed by analysis of a flowgraph extracted from the HDL model. Under this approach, commercial HDL simulators can be directly used for the time-consuming simulation of the first phase, and the second phase can be performed efficiently using concurrent evaluation techniques.

An Example of a Path Coverage Approach Illustrating HSAT Algorithm

For the sake of background, a discussion will now be presented relating to an approach to generating vectors, namely, vectors designed to exercise selected paths in an HDL model. It should be noted that this vector generation technique does not target an observability based metric, but, rather, is target to path coverage. This path coverage approach is reported in an article by F. Fallah, S. Devadas, and K. Keutzer, "Functional Test Generation Using Linear Programming and 3-Satisfiability," in *Proceedings of the 35th Design Automation Conference*, pp. 528–533, June 1998.

This particular path coverage approach provides an example of a recent algorithm for solving hybrid-satisfiability (HSAT) problems.

Under this path coverage approach, selected paths in the HDL model are exercised. The HDL model, as already mentioned, describes the interconnections of arithmetic, logic, and memory modules. Given a path in the HDL model, the search for input stimuli that exercise the path can be converted into a standard satisfiability checking problem by expanding the arithmetic modules into logic gates. Expanding all the arithmetic modules into logic gates, however, is not very efficient.

Here, satisfiability checking is performed directly on the HDL model without converting the arithmetic modules into logic gates. The primary feature of this approach is a seamless integration of linear programming techniques for feasibility checking of arithmetic equations that govern the behavior of data path modules, and 3-SAT checking for logic equations that govern the behavior of control modules. This feature is important to efficiency, since it avoids module expansion and allows work to be done with logic and arithmetic equations whose cardinality tracks the size of the HDL model.

No attempt is made to exercise every path of the HDL model. Rather, the approach is useful with respect to selective path coverage as a metric for functional vector generation.

It should be noted that there is a public domain 3-SAT based test pattern generator available which includes many different heuristics for fast 3-SAT checking. This path coverage approach augments the 3-SAT framework, and uses a commercial linear programming (LP) solver to implement the algorithm.

The functional vector generation strategy for the path coverage based approach will now be described. Given an HDL model, the strategy involves setting up search problems given the path coverage metric, and solving the search problems to obtain input stimuli. Under this approach, an HDL model is viewed as a structural interconnection of modules. The modules can be comprised of combinational logic, and registers. The combinational logic can correspond to Boolean operators (e.g., AND, OR), or arithmetic operators (e.g., +, >).

In connection with this explanation, there is provided an example of a module-level sequential circuit corresponding to a greatest common divisor (GCD) circuit, shown in FIG. 6.

Path testing will now be discussed, and first with a focus on combinational circuits. This strategy of generating functional vectors is to sensitize paths from the circuit inputs to circuit outputs. The sensitization of a path can mean many things, and it is more clearly defined below. In general, sensitizing a path implies that the value at the inputs to the path should affect the value at the output of the path. An important point to note is that buses and word-level variables are not expanded into bit-level variables. Therefore, a path can be a collection of electrically distinct signals.

Since there may be exponentially many paths in an HDL model, a subset is used. This subset is chosen such that at least one path in the subset passes through each module input to each module output. That is, if there is a module with two inputs A and B, and two outputs C and C, paths are chosen that pass through A→C, A→D, B→C, and B→D.

There are other criteria in choosing paths, and the quality of the generated vector set is dependent on these criteria. In this example, full statement coverage in the HDL model is targeted, and this can be achieved by sensitizing a set of paths that cover each module-input/module-output sub path. Path sensitization will now be discussed in more detail.

A path may be understood to be a set of alternating modules and signals, and may be represented by $P=\{s_1, m_1, s_2, m_2, \ldots, s_n\}$. The first signal, $s_1$, is a circuit input, and the last, $s_n$, is a circuit output. For each i, the $s_i$ is an input to module $m_i$ and $s_{i+1}$ is an output of module $m_i$. Sensitizing a path simply corresponds to sensitizing each module $m_i$.

A sub path through a module $m_i$, may be understood to be from $s_i$ to $m_i$ and on to $s_{i+1}$. Sensitization of a sub path through a module will require values at the module side-inputs, i.e., the inputs other than $s_i$ to $m_i$.

For logic gates, the following may be said:

INVERT: no values required.

AND: require side-inputs to be at 1.

OR: require side-inputs to be at 0.

The foregoing rules can be used to determine sensitization for arbitrary collections of logic gates, as well as logic macros such as multiplexers and decoders.

For word-level operators, sensitization needs to be defined on the basis of the logic function of the operator. Arithmetic operators are easy to sensitize; it is necessary merely to check for overflow or underflow. Assuming, for the moment, that it is desired to sensitize the path from A to the module output. Sensitization should reflect the condition that a large enough change in the value of A should result in a change in the module output.

Adder A+B: if there is no concern with overflow, there is no requirement; if there is a concern with overflow, then it is required that A+B<MAX, where MAX is the largest represented number.

Increment A+k: to avoid overflow A<MAX−k.

Subtractor A−B: similar to an adder, except the concern relates to underflow.

Comparator A>B: it is required that B<MAX. For other types of comparators, a similar requirement is used.

Scalar multiplication A*k:

$$A < \frac{MAX}{k}$$

to avoid overflow.

While the above sensitization requirements for logic gates and word level arithmetic operators may appear simple, it should be noted that requirements on intermediate signals in the circuit are sought. Therefore, a Boolean signal c may be requested to be a 1, which is the output of a comparator A>B, where A=C+D. (C and D may be circuit inputs or intermediate signals themselves.)

Here, the method of finding input values that sensitize paths is to:

1. Write sensitization requirements on (intermediate) signal values as described above.

2. Write module-inputs module-output relationships for every module in the circuit.

3. Solve a satisfiability problem that corresponds to 1 and 2 above. This produces an input assignment that satisfies the sensitization requirements and is consistent with the behavior of the logic circuit.

Different sensitization criteria could be used without changing the overall framework just described.

So far, only combinational HDL models have been discussed with respect to the path coverage based approach under consideration. In general, HDL models will be sequential, such as the one in FIG. 6, where registers are intermixed with Boolean and arithmetic operators. The approach to handling sequential circuits is to use the conventional time-frame expansion strategy of sequential test generation (this may be understood to be "unrolling the circuit").

A path may be selected from circuit inputs/register outputs to circuit outputs/register inputs. Once the satisfiability problem for path sensitization is set up and solved, it will be required that the circuit inputs be at particular values, and particular values may be required at the register outputs as well. It may be that certain circuit inputs and register outputs can be left undefined.

The required values at the register outputs next need to be justified. This is done using the time-frame expansion strategy. The initial values of the registers are checked. If the initial values are consistent with the required values, there is no need for justification. Otherwise, an attempt is made to determine circuit input values that produce the required values at the register inputs, so, in the next cycle, the register outputs have the correct values. This is done by solving a new satisfiability problem. If no satisfying assignment can be found, the circuit is time-frame expanded over 2 cycles, and an attempt is made to find a sequence of input values of links 2 that produces the required values at the register inputs, solving a larger satisfiability problem. This process may continue until a user-defined limit on the number of time-frames is reached.

In this path coverage or approach being discussed, there is no attempt to propagate values at register inputs to circuit outputs. This approach assumes that all registers are observable during functional simulation.

As was described above, to generate vectors that sensitize a single path, it is necessary to solve several satisfiability problems for a sequential HDL model. Further, the satisfiability problems encountered in the justification (and propagation) steps may result from a time-frame expanded circuit, which is larger than the original, since combinational logic is replicated. Thus, it is very important that the satisfiability algorithm be as powerful as possible. The algorithm provided under this approach will now be discussed.

This algorithm may be referred to as a hybrid algorithm. This algorithm seamlessly integrates linear programming feasibility and 3-satisfiability checking. It is the correlation between word-level variables and Boolean variables that makes this complex. In general, a word level variable A may appear in an arithmetic operation (e.g., C=A+B), and eight bits-masked version may appear in a Boolean operation (e.g., $d = a_{n-1} \lor b_0$, where V denotes logical OR).

The 3-Satisfiability (3-SAT) approach was pioneered for use in conjunction with stuck-at fault test generation. Here, however, stuck-at fault testing is not of interest; rather, the interest is in justifying values on a collection of signals. That is, given a logic circuit, it is desired to find an input assignment that produces appropriate signal values at circuit outputs, or intermediate signals. The 3-SAT approach converts this problem into one of satisfying a conjunctive normal form (CNF) expression. Each of the clauses in the CNF have that most 3 variables in them, hence the name 3-SAT.

Consider the circuit of FIG. 7. Assume it is desired to find an input assignment that sets the output to a 1. Clauses for each gate in the circuit are written. These clauses model the input-output relationship for each gate, and are shown below:

$$(\bar{X} \lor \bar{Y}) \cdot (X \lor Y) \cdot (\bar{Z} \lor X) \cdot (\bar{Z} \lor Y) \cdot (\bar{X} \lor \bar{Y} \lor Z)$$

In order to produce a 1 at the output of the circuit, the CNF above needs to be satisfied with Z set to 1. This simplifies to:

$$(\bar{X} \lor \bar{Y}) \cdot (X \lor Y) \cdot (X) \cdot (Y)$$

which is clearly not satisfiable.

The algorithm for satisfiability under this path coverage based approach will now be discussed in more detail. It is assumed that there is given an arbitrary interconnection of combinational modules which include Boolean and word-level operators:

AND, OR, and NOT gates;

Comparison: >, >=, <, <=;

Addition/subtraction: +, −;

Increment/decrement: +/−k;

Scalar multiplication: *k;

Left and right shift: <<k; >>k.

Any other word-level or Boolean operator that is not one of those listed above is converted into a collection of the listed word-level and Boolean operators. The word-level operators are all linear.

There is given the required said the values for an arbitrary subset of module outputs, and there may be given additional constraints as described above. The task is to find an input assignment that produces the required output values, or to prove that no such assignment exists. This is called the HSAT problem.

There are two kinds of variables, Boolean variables and word-level variables or integers. The word-level operators operate on word-level variables, or as the Boolean operators work on Boolean (single-bits) variables.

It is possible that Boolean operators are applied to word-level variables. For example, a word-level variable A may be operated upon as A+B, and also as A & C, where & corresponds to a bitwise Boolean AND. To represent the bitwise AND operator O(n) Boolean clauses are written over the bits in A and C, namely, $a_{n-1}, a_{n-2}, \ldots, a_0$, and $c_{n-1}, c_{n-2}, \ldots, c_0$. Here $a_{n-1}$ is the most significant bit in A, and $a_0$ is the least significant bit.

The word-level variable A will be used in a linear arithmetic constraint (LAC) to model the word-level operations on A. The correlation/equivalents between A and $a_i$ will be "remembered", but represented separately throughout the algorithm.

The range of a variable is the set of values that the variable can take. For example, an integer variable A may take on the values −15 to +15. The Boolean variable $a_i$ can only take on the values $\{0, 1\}$.

Given the set of combinational modules listed above, for each module there will be written a set of Boolean clauses defining the relationship between the inputs in the outputs of that module. Below, there follows a description of the clauses for Boolean operators, and linear constraints for word-level operators, respectively.

Boolean clauses for Boolean operators are discussed first, and briefly. Clauses (2-SAT and 3-SAT) for each logical gate are written as already described above, for example, $$z=AND(x,y): (\bar{z} \vee x) \cdot (\bar{z} \vee y) \cdot (\bar{x} \vee \bar{y} \vee z)$$

Linear constraints are written for each of the word-level operators:

$C=A+B: A+B-C<=0$ and $A+B-C>=0$ $C=A+k: C-A<=k$ and $C-A>=k$

For scalar multiplication, the constraints may be written as:

$C=A*k: C-kA<=0$ and $C-kA>=0$

The shift operators << and >> can be viewed as scalar multiplication. In the case of shifting in 1's, it may be necessary to add a constant to the above equations. Cyclic shifts may also be modeled, by adding the most significant bit $a_{n-1}$ to the equations.

Now a situation in which word-level variables and Boolean operators are correlated will be considered. Consider c=A>B. Note that c is a Boolean variable. In the sequel, U refers to $2^n$, where n is the maximum number of bits in A or B. The constraint is written:

$A-B+U(1-c)>=1$.

In the above equation, if c is 1, then the constraint becomes A−B>=1, i.e., A>B. If c is 0, then it becomes A−B>=1−U, which is always true, given that U is large enough. The constraint is also written:

$A-B-Uc<=0$.

If c is 0, then the constraint becomes A−B<=0. If c is 1, then the constraint is A−B<=U, which is always true.

Thus, the two constraints above will express the input-output relationships of a > comparator. Similar pairs of constraints can be written for the other comparators.

Nonlinear operators such as integer multiplication can be decomposed into linear operators.

Given an arbitrary set of modules, there are three types of constraints: 2-SAT clauses, 3-SAT clauses, and linear arithmetic constraints (LAC). The 2-SAT and 3-US sat clauses are over the Boolean variables. The LAC are over the word-level variables, and some Boolean variables. It thus may be said that:

$HSAT=2-SAT+3-SAT+LAC$.

These interacting Boolean and linear arithmetic constraints may thus be said to be a system of interacting Boolean and linear arithmetic constraints. The transformation that allows the integration of linear arithmetic constraints and Boolean clauses in this A satisfiability algorithm will now be described.

Note that there is correspondence or correlation between the word-level variables and Boolean variables. For example, the word level variable A may appear in a LAC, and $a_i$, a bit in A, appearing in a 2-SAT clause. It is necessary to ensure that values of word-level variables in the LAC's are consistent with the values of constituent bits in the Boolean clauses.

Initially, all the variables are unbound or sets to unknown values. During the satisfiability search, which will be described below, Boolean variables or word-level variables may be set. However, if a word-level variable W is correlated to a Boolean variable $w_i$, only the Boolean variable is set to $\{0, 1\}$, and the LAC's that contain W will be transformed. The transformation will now be described.

Assume that $0 \leq W \leq 2^n-1$, i.e., W is a positive integer n bits wide. Suppose that $w_0$ is set to 1 in W. Then, there is introduced a new variable, such as V, and instead of W the following is written: 2V+1. The range of V is smaller than that of W, and it is $2^{n-1}-1$. In general, given a word-level variable W, and an arbitrary number of Boolean variables (bits) in W set to 1 or 0, a linear expression can always be written for the arithmetic value for W using:

$$w=2^{n-1}w_{n-1}+2^{n-2}w_{n-2}+\ldots+2w_1+w_0$$

If W is of n bits, and r bits are set in W, then, in the worst-case, this will require r+1 new word-level variables, assuming none of the r bits is adjacent. As an example, consider a four-bit W, with $w_2$ set. It may be transformed to 8X+4+y, where $x \leq 1$, $y \leq 3$. X is effectively a Boolean variable, and Y is a two-bit integer. W is no longer needed, so the increase in the number of variables is at most r.

For signs/magnitude or two's complement integers, the appropriate equation is used that corresponds to the arithmetic value of the integer based on the individual bits. For example, the two's complement equation for an n+1-bit number W, whose most significant bit is the sign bit, would be:

$$w=-2^nw_n+2^{n-1}w_{n-1}+2^{n-2}w_{n-2}+\ldots+2w_1+w_0$$

Thus, given an arbitrary setting of Boolean variables that correlates to word-level variables in a LAC, the LAC can be modified into another LAC using the method outlined above. The left-hand side of the LAC is modified and the right hand side remains the same. Simple algebraic manipulation is applied to normalize the LAC. I.e., to convert to a standard form $\Sigma_i a_i w_i \leq C$ or $\Sigma_i a_i w_i \geq C$. The modified LAC will typically have more variables then the original LAC, however, the ranges of the variables will be smaller. Further, there is no exponential increase in the number of variables or constraints; the total number of constraints and the total number of variables in the LAC will grow no more than the number of Boolean variables that are set to 0 or 1.

The above transformation is key to the seamless integration of Boolean clauses and LAC in this hybrid satisfiability algorithm. Next, there is described the satisfiability search which uses the above transformation, so word-level operators are expanded only when needed, resulting in greater efficiency.

If the LAC is empty, various special cases can be checked for in the 3-SAT clauses.

Essential variable: If a clause contains a single variable in true form (complemented form), clearly the variable has to be set to 1 (0) for the clause to be satisfied.

Dominating clause: If two clauses (a∨b) and (a∨b∨c) exist, the latter clause can be deleted since the former implies the latter.

Unate variable: If a variable a appears only in true form, (complemented form) in all the clauses, the variable can immediately be set to 1 (0).

There are many other optimizations that could be applied for the 3-SAT problem.

In the general case, the LAC will be non-empty. Essential variables can still be checked for, and dominating clauses can be deleted. However, variables that are unate with respect to the Boolean clauses cannot be set without checking for correlation in the LAC. For example, given:

$$(w_0 \lor a \lor b)$$

$$W + X \leq 5$$

with $w_0$ only appearing in the one clause shown, it's still cannot be assumed that $w_0=1$, because $w_0$ is correlated with W. in order to satisfy the clauses and LAC, $w_0=0$, a=1 might be needed.

The standard branching search is still performed to find a satisfying assignment. Only variables corresponding to inputs to the circuit will be set, and not intermediate signals (the intermediate signals may be set by implication on the clauses). First, special case pruning is performed, such as the checks mentioned above. There is a lot of structural information that can be exploited to simplify the 3-SAT clauses.

Regardless of correlation among bit-level and word-level variables, the following can be asserted:

Polynomial-time checks using cycle detection can be performed to see if 2-SAT+3-SAT is not feasible. If 2-SAT+3-SAT is infeasible, so it is HSAT. Note that, for 3-SAT, even if cycle detection fails, the problem may still be infeasible.

Full-fledged CNF satisfiability algorithms can be run with a limit on the number of back tracks in search, to possibly prove infeasibility of 3-SAT.

The linear program relaxation (LPR) of the LAC's corresponds to relaxing the assumption that the word-level variables are integral (that is, they can be real). If the LPR corresponding to HSAT=2-SAT+3-SAT+LAC is infeasible, then the HSAT problem is infeasible.

If the problem is not infeasible, a Boolean variable or a word level variable is heuristically selected. If a Boolean variable is selected, it is set to 1, and the clauses and LAC's are modified appropriately, and the satisfiability procedure is recursively called. If no satisfying assignment is found, the Boolean variable is then set to 0, the clauses and LAC's are modified, and the satisfiability procedure is again recursively called. The selection of the variable is dependent on how many clauses and LAC's it appears in. In the case of selecting a word-level variable, a check is made to see that no unknown Boolean variable correlated with that word-level variable exists (if so, another word-level variable or a Boolean variable is selected). The range of the word-level variable is split, and the two smaller ranges are used. The split is based on the value of the variable returned by the LPR. That is, if the word-level variable's range is [−7, 7], and the LPR returns a value of 4.5 for the variable, the procedure will recur on the [−7, 4] and [5, 7] ranges. The only modification necessary, in this case, is to the LAC.

It is possible that LPR may return a feasible solution, but no integer solution may exist. If the LPR is feasible, and if the solution is integral and consistent across the word-level and bit-level variables, then there is a feasible solution to HSAT, and the procedure can stop.

When LPR returns a feasible, non-integral solution, a simple perturbation of the solution returned by LPR is performed to see if the solution can be made integral, while satisfying the consistency requirements. If so, there has been found a feasible solution to HSAT.

The CPU time allowed for search may be limited by limiting the number of back tracks. Given a certain number of back tracks, three things may happen:

1. An input assignment is found which produces the required output values.

2. It is determined that no input assignment satisfies the required values.

3. The certain number of back tracks may be exceeded before either of possibilities 1 or 2, mentioned above, occurs. In this case, the algorithm has failed to find a solution.

For example, consider the heavy path shown in FIG. 6. Assume it is desired to sensitize this path. There are three requirements:

Assuming unsigned numbers, to avoid underflow in the subtractor, it will be required that x>=y.

It will be required that c=1. This will translate to x>y when the module-input module-output relationships are included.

It will be required that d=0. This directly translates to rst=0.

Another example is depicted in FIG. 8, where LPR quickly detects infeasibility, but gate-level satisfiability typically requires a large number of back tracks to prove infeasibility. The bold path in the Fig. is FALSE, i.e., there is no assignment to the word-inputs X, Y, and Z that sensitizes it. One call to LPR will determine this. If gate-level satisfiability is used, the number of back tracks will depend on the order in which the bits of X, Y, and Z are assigned to O/I values. If the words are n bits wide, and the least significant bits are begun with, establishing infeasibility will require $O(2^{3n})$ back tracks. If the most significant bits of X, Y, and Z are set first, gate-level satisfiability will still require $O(2^n)$ back tracks, because infeasibility will not be detected for the cases of $x_i=y_i=z_i=0$ and $x_i=y_i=z_i=1$. It is possible that bits of word X or Y or Z appear in Boolean clauses due to additional circuitry. However, since correlation is taken into account during the search, appropriately modifying the LAC will allow the use of LPR and will outperform gate-level satisfiability.

If ordered Binary Decision Diagrams are used, under the right ordering, the BDD's for the outputs of the comparators will grow linearly with bit-width. To determine infeasibility it is necessary to compute the intersection of the three BDD's, and the time required for this will grow super-linearly with bit-width. Further, for more complex sets of (linear) arithmetic constraints, it is difficult to find an ordering (assuming one exists) that results in BDD's of reasonable sizes.

Satisfiability problems generated during the justification step are similar to those generated in the path sensitization step. There are the module-input, module-output relationships, and additionally a requirement of particular values on register inputs.

The two primary reasons why the hybrid satisfiability algorithm may fail for a particular problem are nonlinear operations and large sequential depths. In this methodology, nonlinear operators have to be decomposed into linear arithmetic or Boolean operators. There are choices in the decomposition process. For example, it is possible to decompose nonlinear multiplication A*B into a large set of Boolean clauses. However, it is usually more efficient to transform this into linear constraints as described above.

Time-frame expansion works well for circuits with small sequential depths such as data paths, and small finite state machines. One case where time-frame expansion may become prohibitively expensive is when there are timers or counters in the circuit.

A Problem Solved by the Invention

The first observability based approach relates to how to compute coverage given a set of predetermined input vectors. That is, the vectors must have already been selected prior to using the techniques described in the first observability based approach. The same may be said of the second observability based approach, which includes a more efficient way of computing the coverage for a set of input vectors that have already been selected. Neither of these two approaches describes how to generate vectors that, in the first instance, target the observability based coverage metric.

Previous efforts toward automated vector generation have not targeted the observability based coverage metric. For example, the article that describes the path coverage approach and the HSAT algorithm, described above for the purpose of explaining the HSAT algorithm, mentions how to automatically generate vectors but does not target the observability based coverage metric. Instead, this article describes automatic vector generation that targets a path coverage metric. In particular, it is a selective path coverage metric and not a complete path coverage metric.

The problem, then, in the VLSI design and verification field, is that there is no method for automatically generating vectors that target the observability based coverage metric. Such a method is needed.

SUMMARY OF THE INVENTION

It is therefore an object of the invention to solve the problem just mentioned.

More particularly, it is the object of this invention to provide a procedure for vector generation for observability-based statement coverage for HDL representations by combining vector generation with error simulation. The errors are modeled as tags. An HSAT procedure is used for vector generation.

In one embodiment, the object of the invention is realized in a method for vector generation which includes providing a representation of a design to be validated, automatically generating vectors that target the observability metric, and simulating errors (tags) for the representation. The simulation of errors includes modeling the errors as tags, and injecting the tags in the HDL code to determine the extent to which perturbations in a value at a location in the code will result in a value which is observable, i.e., propagates the error to an output or a register. In a preferred embodiment, the generation of the vector includes using a hybrid linear programming and Boolean satisfiability procedure. This procedure is also referred to as an HSAT procedure. The preferred embodiment also includes checking for tag coverage after each vector is generated, which may be referred to as repeated coverage computation.

To generate a vector, a tag list is prepared with each tag corresponding to one of the variable assignments in the HDL code 180. All the tags start out as uncovered, and then for each uncovered tag, the set of transitive fanout variables is marked and it is attempted to generate a vector that covers the uncovered tag by generating a set of linear and Boolean constraints, setting up an HSAT problem using those constraints, and finding a solution to the HSAT problem by solving the set of constraints. When such a vector can be generated, the tag is said to be covered by that vector, and an error occurring at the given location may be propagated to an observable output. After the vector is generated, tag simulation may be performed and any other tags covered by that same vector may be identified.

In the other preferred embodiments of the invention, different ways to help speed up the overall process are provided. For example, this includes randomly generating vectors and performing tag simulation with them, or generating constraints for only a limited number of paths at a time. In addition, the objective of the invention is also achieved in an especially preferred embodiment by maximizing the magnitude of the tags.

To put it another way, an important contribution of this invention is thus an automated vector generation procedure targeting the observability-based statement coverage metric. The invention, in one embodiment, provides for repeated coverage computation so as to minimize the number of generated vectors. The invention provides for various techniques to set up constraints based on the observability-based statement coverage metric. The constraints include interacting linear and Boolean constraints, and to solve this system of constraints, recent algorithms for solving HSAT problems are augmented. Various embodiments of the invention provide heuristics to control the number of constraints generated. In particular, the invention provides for the establishment and maintenance of a tag list during vector generation. Tags, which model the presence of an error, are associated with each variable assignment in the HDL code 180. After the generation of each vector, coverage by this vector of others of the tags in the HDL code 180 is determined using the efficient coverage computation procedure from the second approach to observability based coverage described above. Covered tags are deleted from or flagged in the tag list. The process is continued until all tags under the metric are covered, i.e. the tag list is empty, or until it is determined that the process will not generate a vector for a given tag within a predetermined period of time or within a predetermined level of computational effort.

The invention also involves a computer system, and computer program product for implementing the foregoing method. The invention, which will be explained with reference to various embodiments, will be better understood from the included figures which are provided merely for the sake of explanation, and are not intended to limit the invention.

BRIEF DESCRIPTION OF THE DRAWING FIGURES

DETAILED DESCRIPTION OF THE PREFERRED EMBODIMENTS

Computer Systems and Computer Program Products

Figure 1:
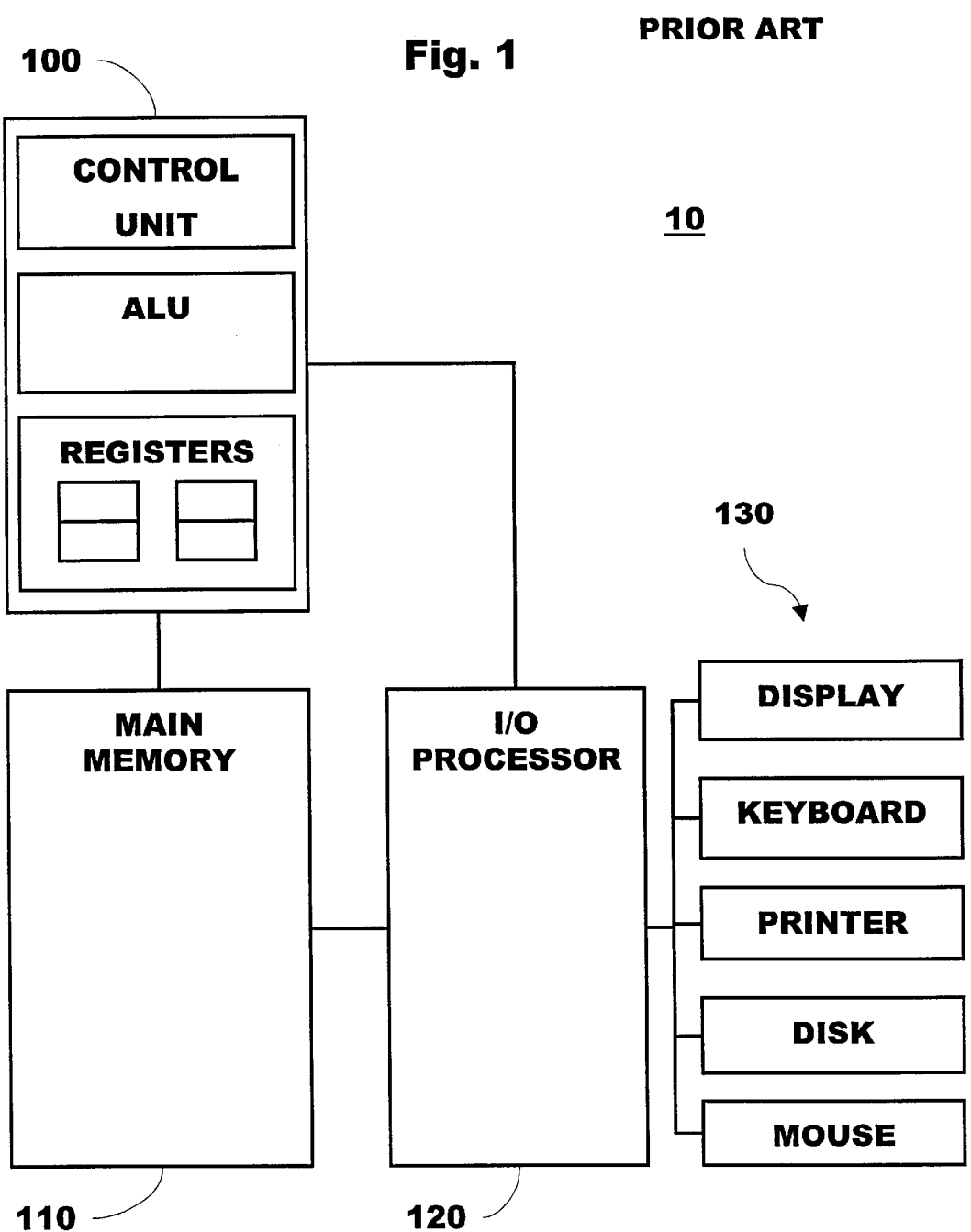
FIG. 1 shows a computer system.

One embodiment of this invention resides in a computer system having the structure shown in FIG. 1. Here, the term "computer system" is to be understood to include at least a memory and a processor. In general, the memory will store, at one time or another, at least portions of an executable program code, and the processor will execute one or more of the instructions included in that executable program code. It will be appreciated that the term "executable program code" and the term "software" mean substantially the same thing for the purposes of this description. It is not necessary to the practice of this invention that the memory and the processor be physically located in the same place. That is to say, it is foreseen that the processor and the memory might be in different physical pieces of equipment or even in geographically distinct locations.

The invention may be embodied in a computer program product, as will now be explained.

On a practical level, the software that enables the computer system to perform the operations described further below in detail, may be supplied on any one of a variety of media. Furthermore, the actual implementation of the approach and operations of the invention are actually statements written in a programming language. Such programming language statements, when executed by a computer, cause the computer to act in accordance with the particular content of the statements. Furthermore, the software that enables a computer system to act in accordance with the invention may be provided in any number of forms including, but not limited to, original source code, assembly code, object code, machine language, compressed or encrypted versions of the foregoing, and any and all equivalents.

One of skill in the art will appreciate that "media", or "computer-readable media", as used here, may include a diskette, a tape, a compact disc, an integrated circuit, a ROM, a CD, a cartridge, a remote transmission via a communications circuit, or any other similar medium useable by computers. For example, to supply software for enabling a computer system to operate in accordance with the invention, the supplier might provide a diskette or might transmit the software in some form via satellite transmission, via a direct telephone link, or via the Internet. Thus, the term, "computer readable medium" is intended to include all of the foregoing and any other medium by which software may be provided to a computer.

Although the enabling software might be "written on" a diskette, "stored in" an integrated circuit, or "carried over" a communications circuit, it will be appreciated that, for the purposes of this application, the computer usable medium will be referred to as "bearing" the software. Thus, the term "bearing" is intended to encompass the above and all equivalent ways in which software is associated with a computer usable medium. For the sake of simplicity, therefore, the term "program product" is thus used to refer to a computer useable medium, as defined above, which bears, in any form, software to enable a computer system to operate according to the invention described herein.

Observability Based Coverage Metric, Tags, and Locations

Figure 3:
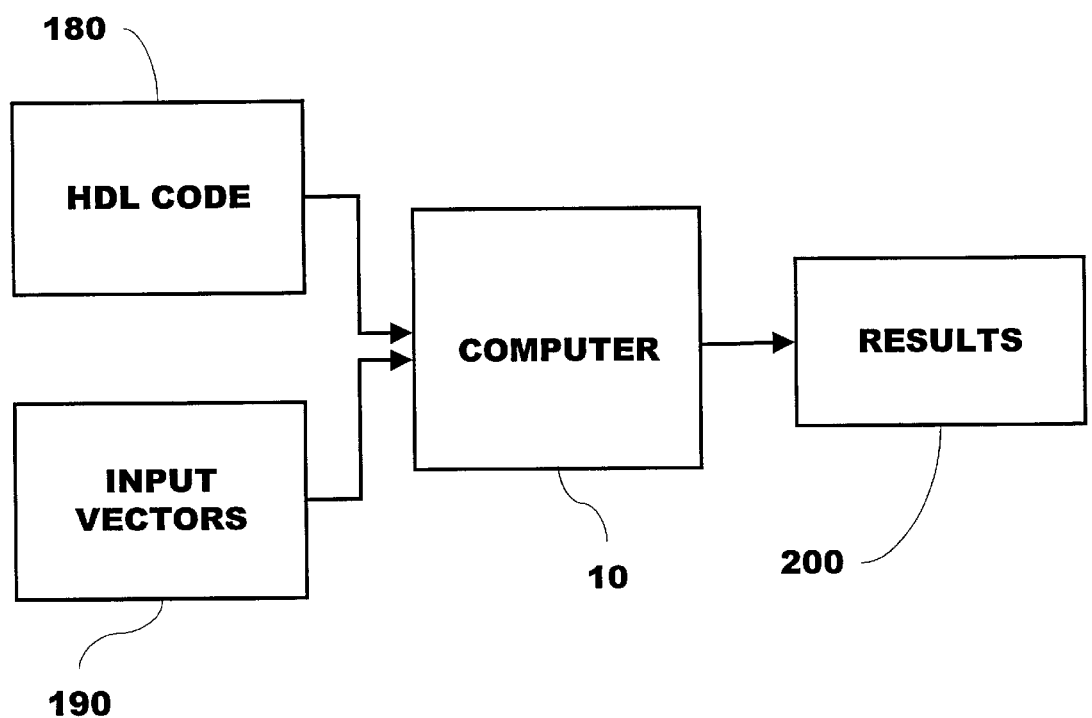
FIG. 3 shows a computer system that may be used to implement the invention.
Figure 4:
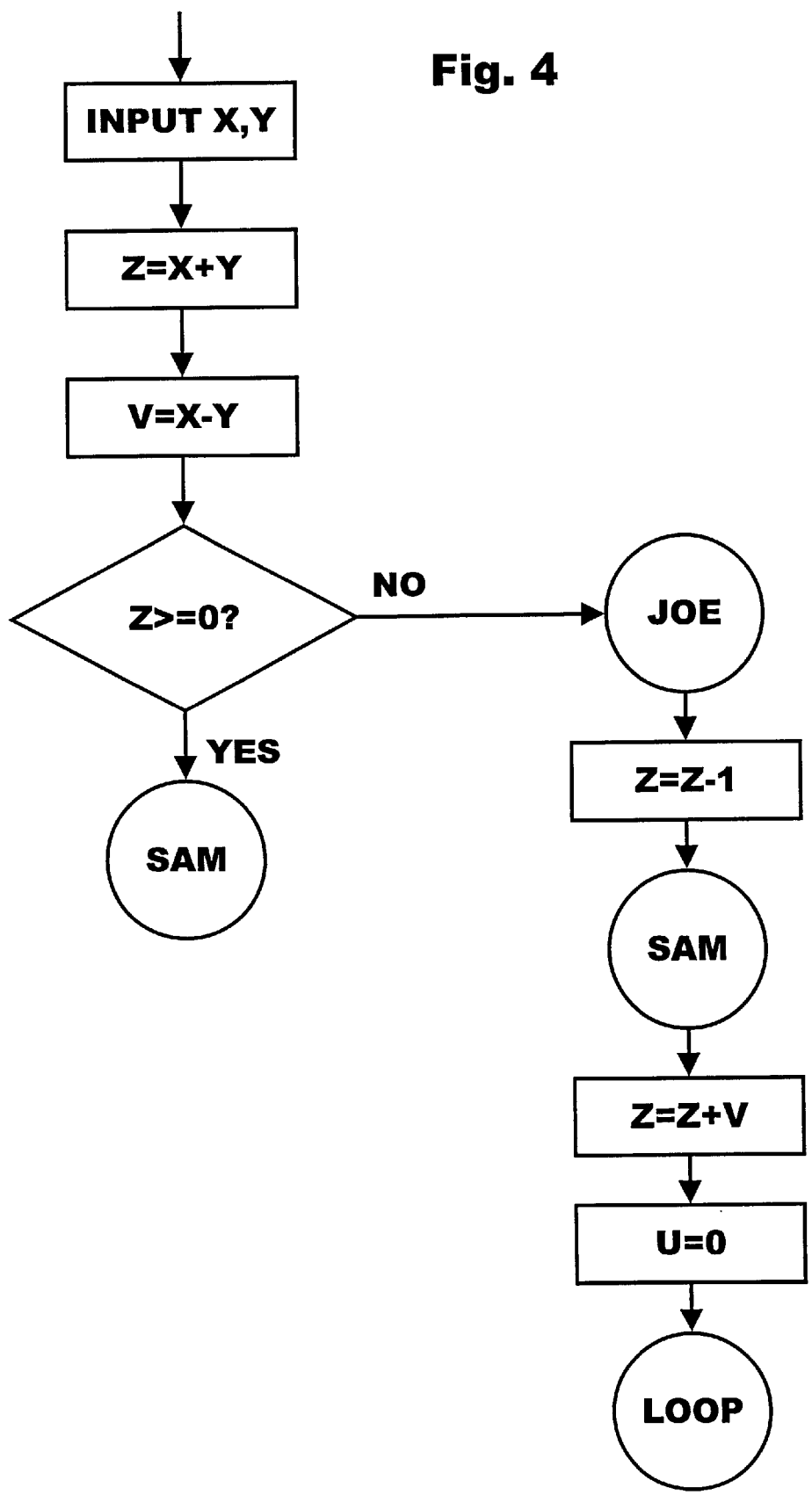
FIG. 4 shows an example data flowgraph.
Figure 5:
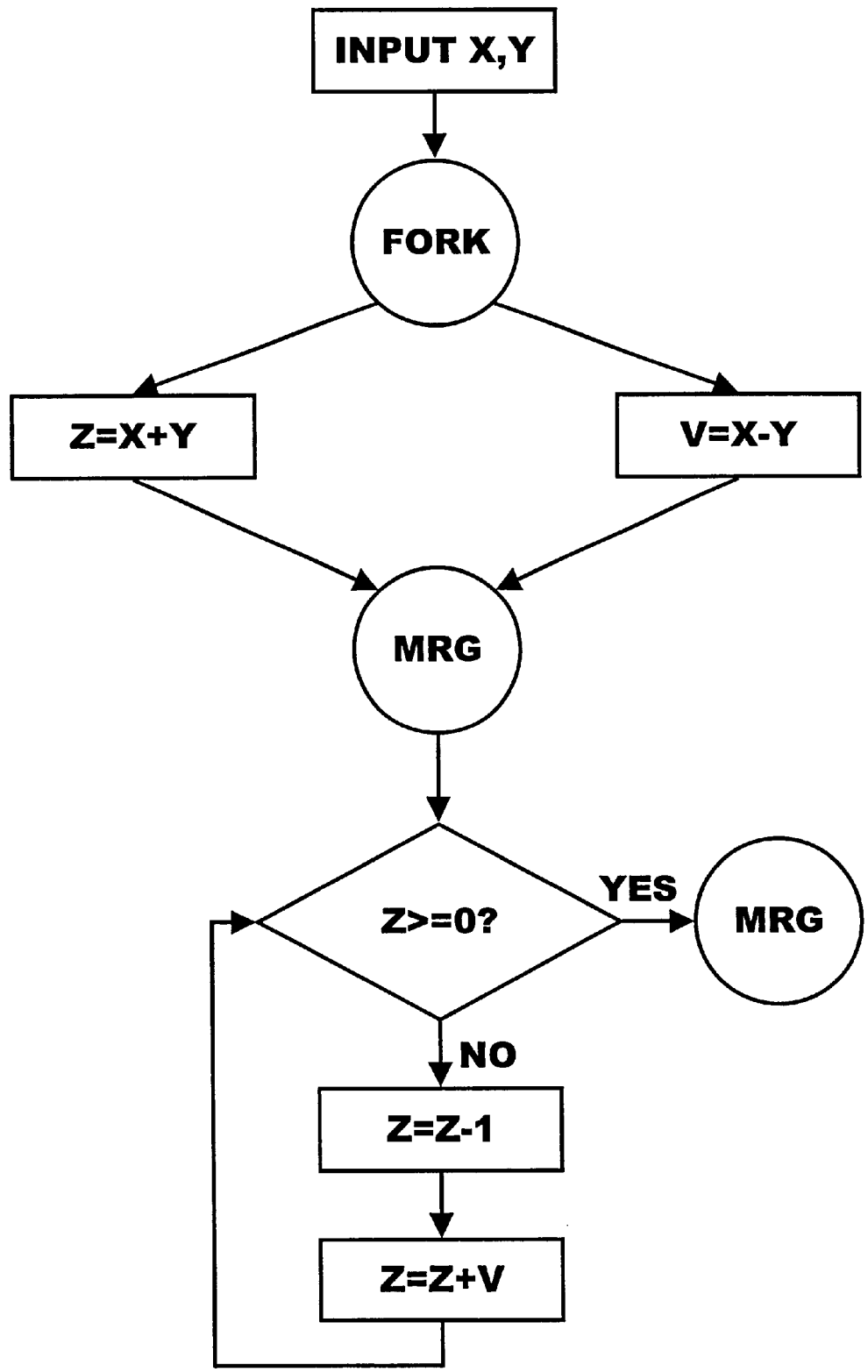
FIG. 5 shows the data flowgraph of FIG. 5 modified to accommodate parallel operations.
Figure 6:
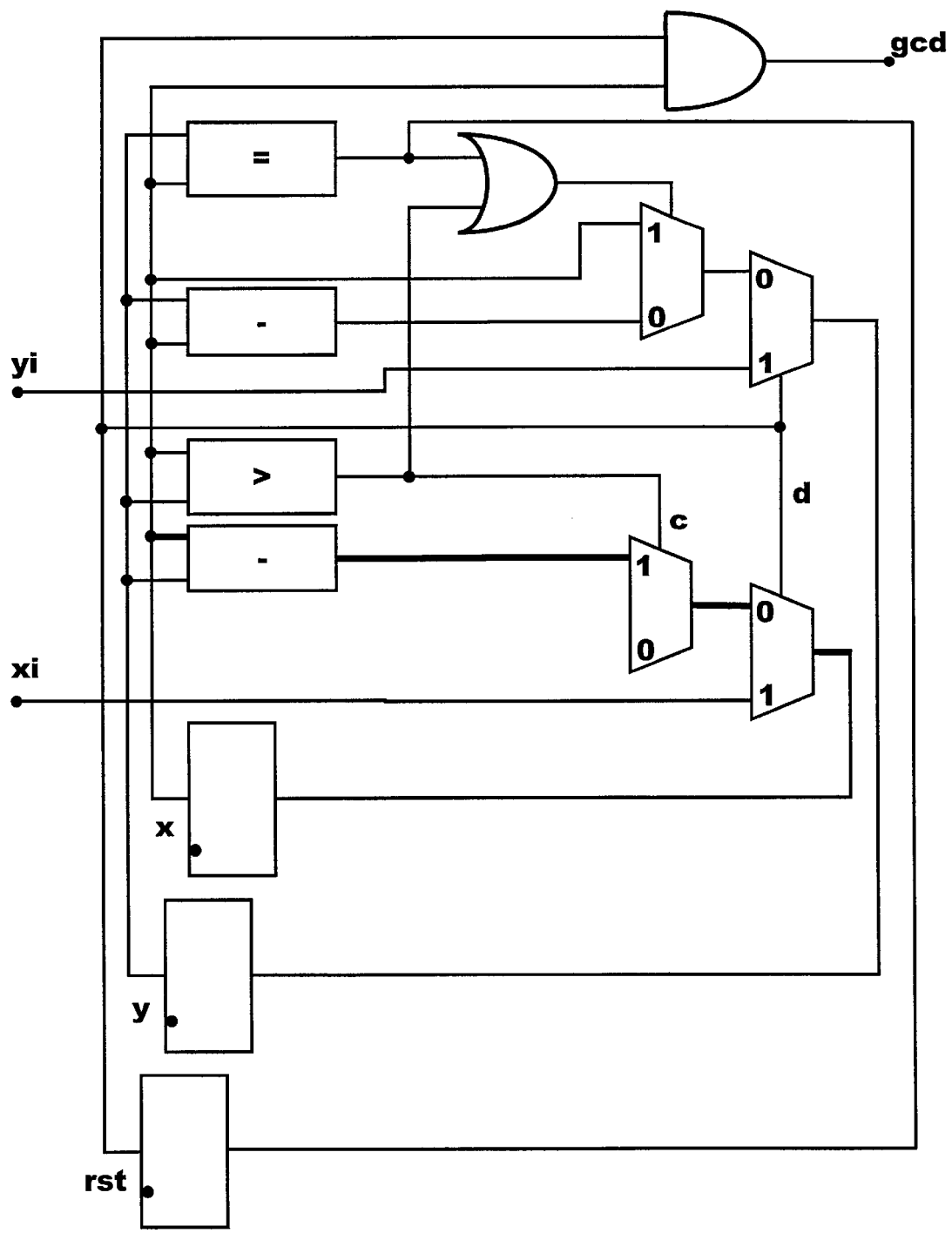
FIG. 6 shows a circuit used to explain the solutions of problems using a hybrid satisfiability approach.
Figure 7:
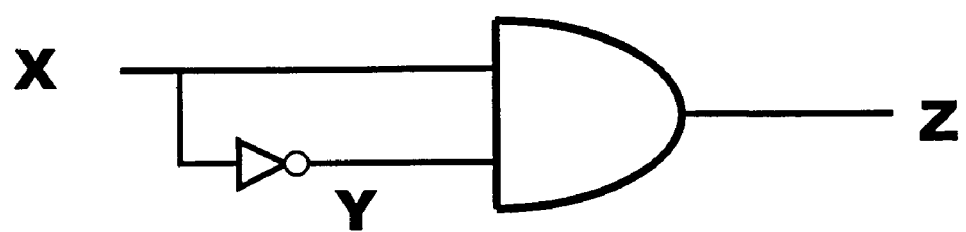
FIG. 7 shows another circuit used to explain the hybrid satisfiability approach.
Figure 8:
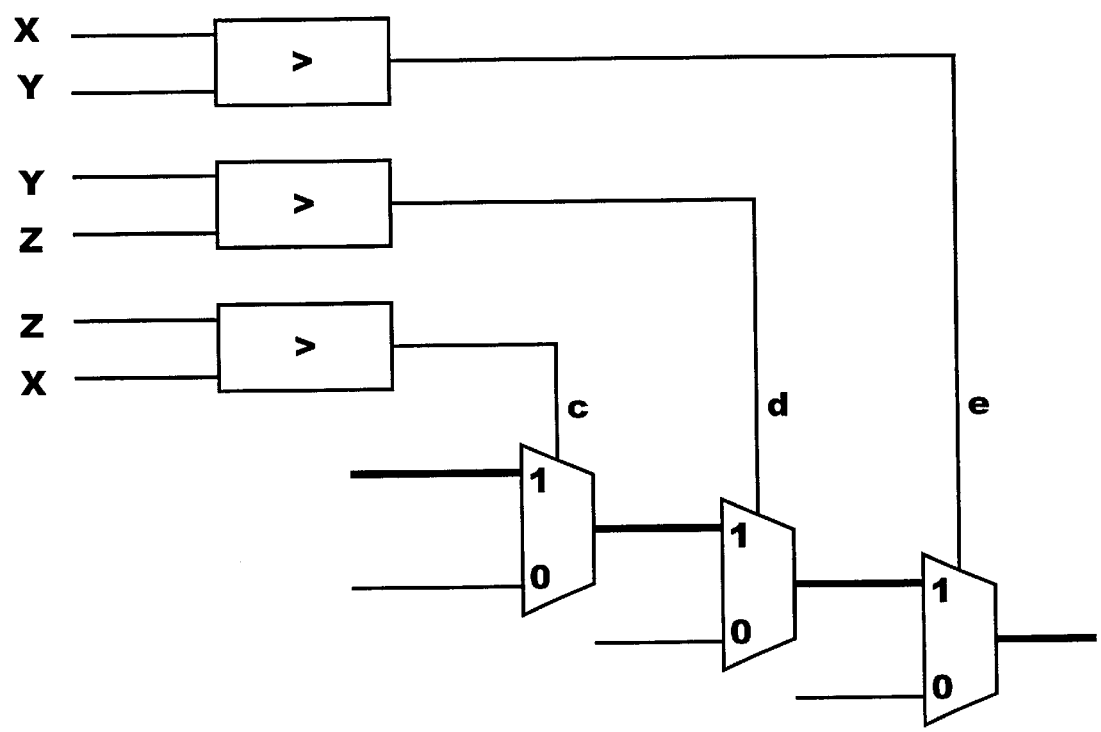
FIG. 8 shows yet another circuit used to explain the hybrid satisfiability approach.

The purpose of an observability-based coverage metric is to evaluate vectors for their ability to propagate an error, present at a specific location in the HDL code 180 shown in FIG. 3, to some output. This is much harder to do than computing a controllability metric which just determines whether a vector results in a statement being visited.

It will be understood that, in HDL code 180, the assignment of a value to a variable is where an incorrect value could be computed. For example, where the actual expected value of a variable after an assignment should be x, if there is an error in the design, the actual value might be $x+\Delta$. According to the invention, a tag is used to model the possibility that an incorrect value is computed at such an assignment. Tags, therefore, correspond to locations in the HDL code 180 at which assignments are made to variables. For linguistic convenience, the term "location" will be used in the following description as a shorthand to convey the idea of a location in the HDL code 180 at which an assignment is made to a variable.

A tag is just a label. It does not have a value, and has nothing to do with how the erroneous value was generated. A tag does have a magnitude. The magnitude of the tag may be represented by the symbol $\Delta$. A tag is either present or absent. It does have a sign associated with it which helps determine if it can be propagated forward. As will become clear, these limited attributes associated with the tag lead to an inherent pessimism in the coverage metric. At the expense of a few extra vectors, this pessimism leads to greater confidence in the ability of vectors satisfying the coverage metric to detect real design errors.

Figure 2:
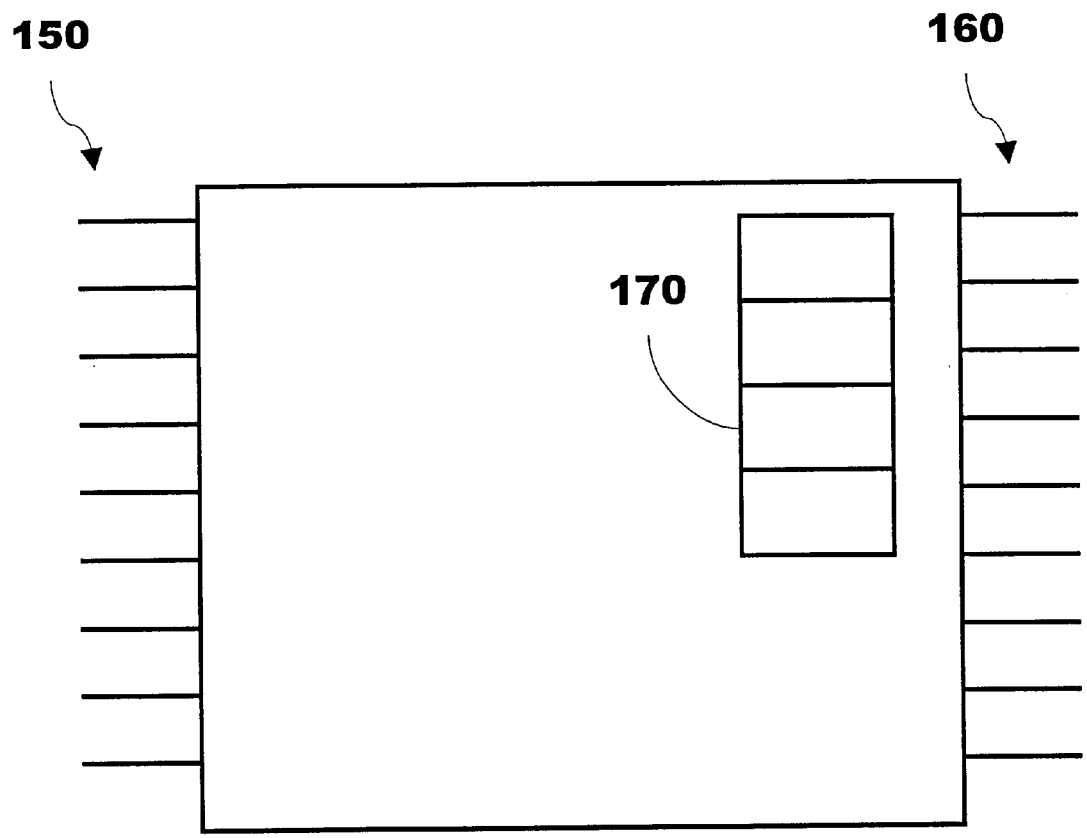
FIG. 2 shows a circuit being simulated.

Given a vector and a location in the HDL code 180, a tag at the location is said to be covered by the vector under this coverage metric if it is determined that the tag can be propagated to some output or to some register by the vector. The propagation of a tag may be blocked because of interaction between data values. For example, if one input to a two-input multiplier has a tag on it while the other input is zero, the tag can never be propagated to the output of the multiplier. To say that a tag can successfully be propagated to an observable output means that a vector which covers the tag can be used as a simulation input (to inputs 150 of FIG. 2, for example), and the corresponding output of the circuit being simulated will be an output 160 which is useful for comparison with the output behavior described in the specification of the circuit. Successful tag propagation, in other words, implies that the vector will be able to distinguish between the behavioral specification and an erroneous RTL implementation. Given a vector, the task of the coverage computation procedure is to efficiently determine all the tags that will be covered by a vector. As a practical matter, in the invention, only a single tag model is used. That is, a tag is injected at only one location at a time.

Coverage Computation

A brief review of the idea of coverage computation will now be provided. Coverage computation, of course, requires that generation of at least one vector has taken place.

Coverage computation when a vector is already known may be done by means of a two-step approach. In the first step, the vector in question is simulated on a modified version of the original HDL code 180 to determine values on all the internal variables. The modifications are independent of the vector and must be done only once. Tag injection and propagation is carried out in the second step. This step essentially checks if all possible perturbations in value at the location being tested will result in a perturbation in the value of some output for the specific vector in question. A feature of the coverage computation method is that the tag injection and propagation step is performed for all tag locations by means of a single pass algorithm. Details of the code transformations required and the tag propagation algorithm can be found in the section describing the second observability based approach, above.

HSAT

Given a Boolean equation, Boolean satisfiability (SAT) is the problem of finding an assignment of variables so that the equation evaluates to one, or to establish that no such assignment exists. Typical SAT algorithms convert the Boolean equation into a conjunctive normal form (CNF) and apply a branch-and-bound algorithm to find the solution. SAT algorithms have found successful application in CAD in stuck-at fault test generation (see the article entitled "Test Pattern Generation Using Boolean Satisfiability").

Vector generation from HDL code 180 targeting a chosen coverage metric can also, in theory, be set up as a purely Boolean satisfiability problem. Given that HDL code 180 consists of word-level arithmetic operators in addition to logic gates, this would not, as a practical matter, be a very efficient approach. In the example of a path coverage approach, above, the Boolean and word-level domains were kept distinct, and only their interaction for the specific variables shared between the two domains was modeled. This is an efficient approach. Linear constraints are solved in the linear programming domain, while Boolean clauses are solved using a SAT solver. Completeness is ensured by checking the feasibility of the linear constraints for each path to a leaf in the branch-and-bound tree of the SAT solver. This is accomplished, in practice, by checking the feasibility of the linear constraints each time a Boolean variable is assigned in the SAT solver. When there is a choice of the next variable to assign, either a Boolean variable, or a word-level variable with no direct correlation to a Boolean variable is picked. If a word-level variable is picked, the feasibility of a solution must be checked for the entire range of the variable. The feasibility of linear constraints is checked by relaxing the constraint that the word-level variables be integral. If the problem is infeasible with this relaxation, the original problem is infeasible. The integral constraint is imposed only at the leaves of the SAT branch-and-bound tree. Because of the correlation between the Boolean and word-level variables, some optimizations in the SAT solver algorithm cannot be used in the hybrid problem. Even so, the hybrid algorithm is much faster than alternatives.

The problem of solving for a mixture of Boolean and linear constraints is described herein as a Hybrid SAT (or HSAT) problem, and is described above in the example of a path coverage metric. This approach is adopted in presently preferred embodiment of the invention.

Automatic Vector Generation

Details of the vector generation method according to the invention will now be provided. The goal of the vector generation method is to generate vectors 190 so that each tag (denoted $\Delta$) is propagated to an output 160 by some vector. In other words, the goal is to generate one or more vectors 190 which, when used as inputs 150 in simulation of a circuit 20, will propagate any errors occurring in variable assignments to an observable output. The following example contains many specificities, but these specificities are provided only for the sake of improved understandability.

The HDL description of the design may first be compiled into structural RTL. This may be accomplished by compiling a Verilog (see *The Verilog Hardware Description Language*) description into BLIF-MV. A graph G(V,E) encapsulating the dependencies between operators may be built from the RTL description. This graph may be understood to be substantially similar to a flowgraph. The graph may have two types of nodes, operator nodes and latch nodes. Operator nodes, which may be represented by $V_{OP}$, correspond to the instantiation of operators in the RTL description. Latch nodes, which may be denoted by $V_L$, correspond to latches in the RTL description. In such a graph, each edge E may correspond to a variable in RTL description. An edge from $V_1$ to $V_2$ exists if there is a data dependence between operators or latches corresponding to $V_1$ and $V_2$. It should be noted that a graph such as one just described, and a RTL circuit representation, are just two different representations of the functionality embodied in the HDL code 180.

The Basic Method of the Invention

Figure 9:
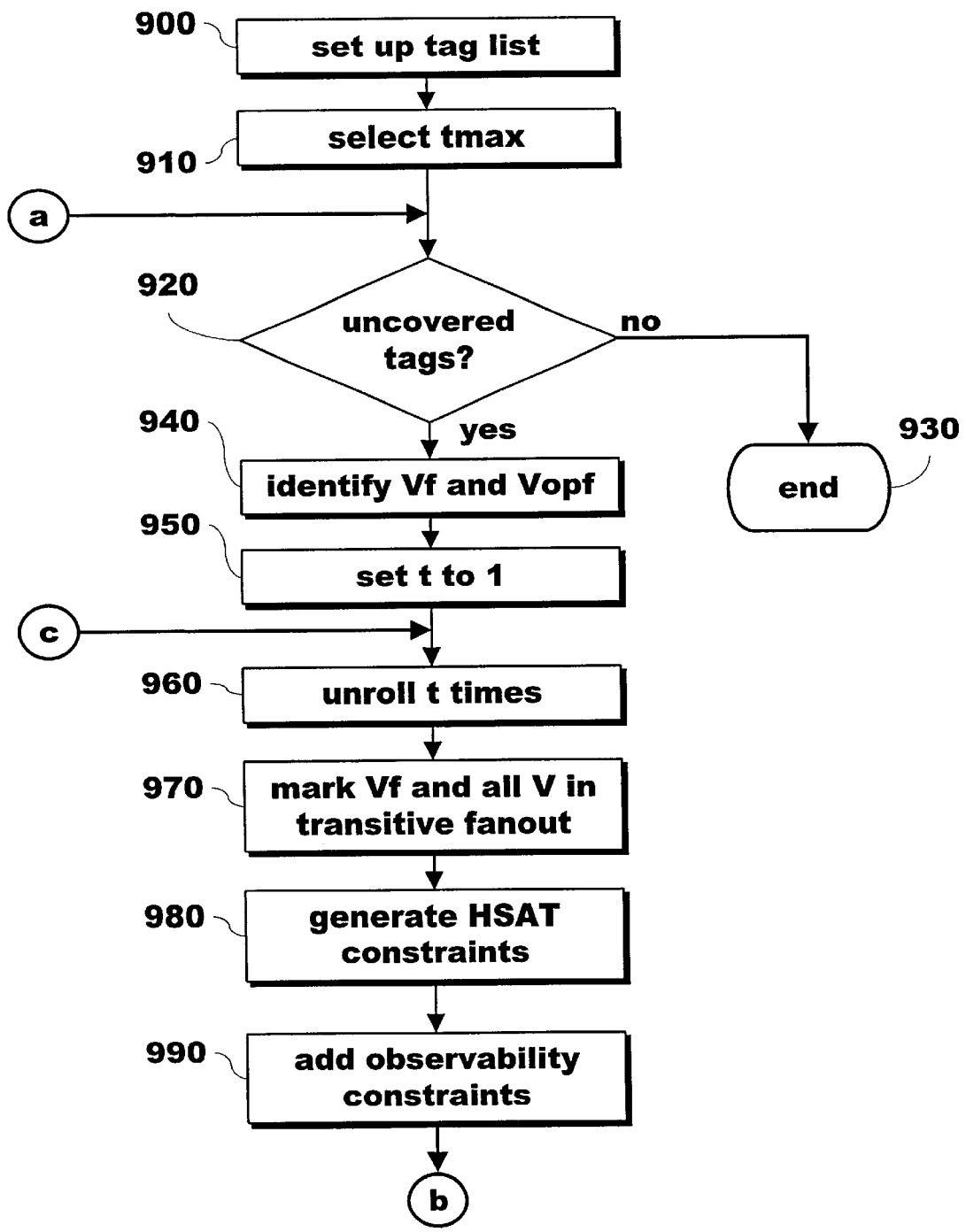
FIG. 9 shows a part of the process for generating vectors according to the invention.
Figure 10:
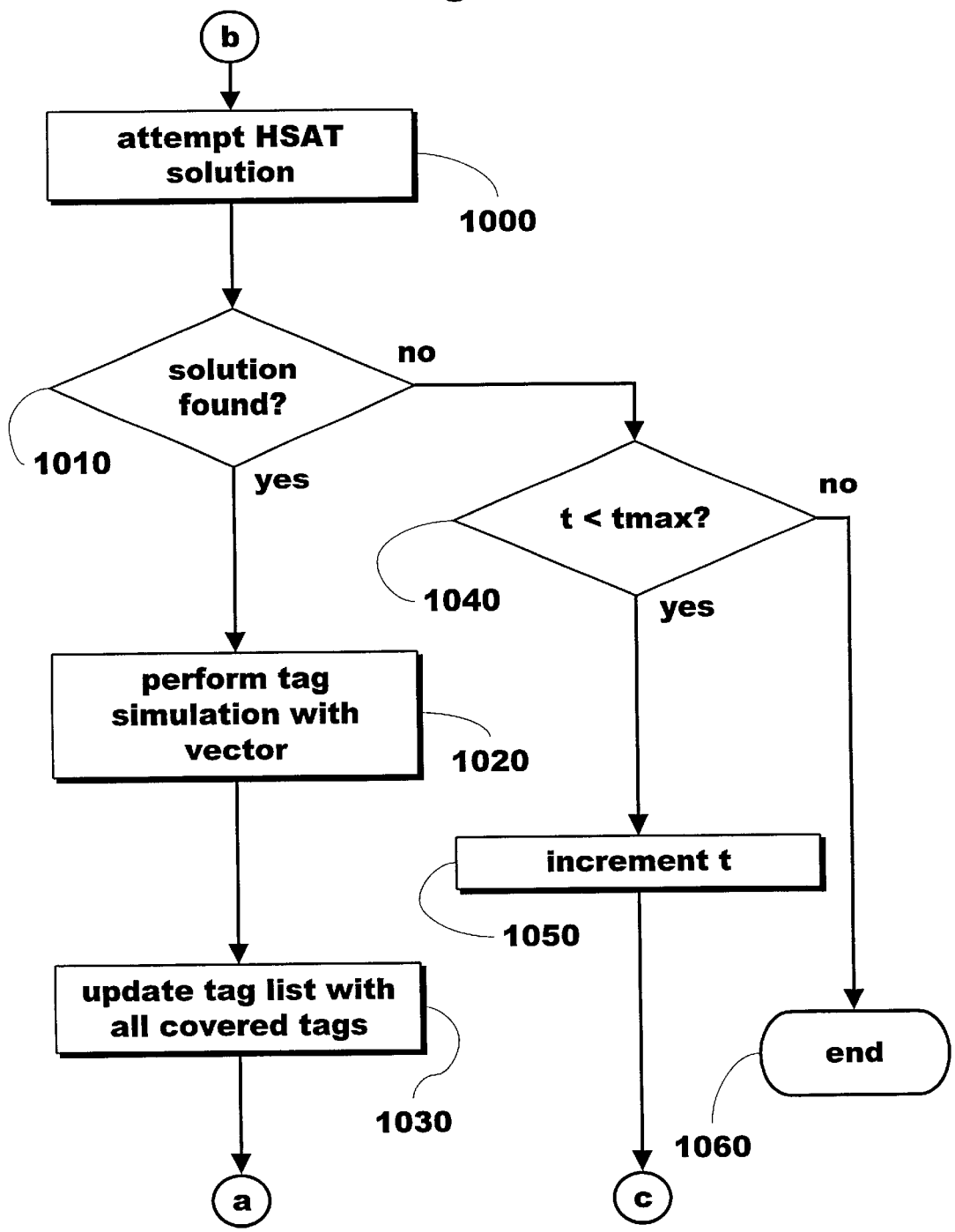
FIG. 10 shows another part of the process for generating vectors according to the invention.

The basic method operates according to the following steps, described in conjunction with FIGS. 9 and 10:

1. A tag-list is set up in step 900. As the method proceeds forward, tags are removed from the list as vectors are found to cover them. Ideally, the tag-list should be empty when the method completes at step 930.

2. An upper bound on number of time frames, $t_{max}$, that will be used for vector generation may be selected at step 910.

3. A check is made to see if any uncovered tags exist in step 920. If there is no uncovered tag, the method stops at step 930. Otherwise it selects an uncovered tag to generate a vector for in step 940. The variable $V_f$ and the operator $V_{opf}$ corresponding to this tag are identified.

4. t, which denotes the number of time frames that the design will be expanded to (or unrolled) in the current attempt, is set to 1 in step 950.

5. The graph or circuit is unrolled from its original description t times in step 960. $V_f$ and all variables in its transitive fanout are marked in step 970. Unrolling is discussed further below.

6. HSAT constraints for both tagged and untagged versions of the circuit are generated according to the techniques in the example of a path coverage metric given above in step 980. For the tagged circuit, constraints with no marked variables in them are ignored. $V_f$ is replaced by $V_f+\Delta$ in constraints corresponding to $V_{opf}$. For the untagged circuit, constraints are generated for only the portion of the circuit in the fanin of marked outputs.

7. Constraints are added so as to express the requirement that the tag be detected on at least one of the marked variables which is also an output of the circuit, as shown in step 990. For example, if variables $E_{O1}$ and $E_{O2}$ are marked outputs, the added observability constraint will be the following, where V represents Boolean OR:

$$(E_{O1} > E_{O1f}) V (E_{O1} < E_{O1f}) V (E_{O2} > E_{O2f}) V (E_{O2} < E_{O2f}).$$

8. An attempt to solve the HSAT problem is made at step 1000 (see FIG. 10) using substantially the method described in the example of a path coverage metric, above, but with enhancements as described below.

9. At step 1010, it is determined whether a solution is found to the HSAT problem. If there is no solution to the HSAT problem, it is checked whether $t<t_{max}$. If it still is less than the maximum value selected in step 910, t is incremented by 1 and processing continues with step 960.

10. If there is no solution to the HSAT problem, and t is not less than $t_{max}$, the method reports that the tag cannot be covered within $t_{max}$ time frames, and may end at step 1060. Alternatively, the method could proceed to step 940 and begin to attempt to generate vectors 190 for the remaining tags.

11. For the vector generated, tag simulation is performed at step 1020 using a method akin to that in the second observability based approach, already described above, to detect all the tags which can be covered by this vector. The method updates the tag-list at step 1030 and reverts to step 920.

It should be noted that, in a strict sense, steps 1020 and 1030 are not absolutely essential to the practice of the invention. To explain, it will be appreciated that the invention resides in the automatic generation of vectors that target the observability based coverage metric. Steps 1020 and 1030 may be viewed as enhancements to the invention because they avoid generating vectors for tags that might have been covered by previously-generated vectors. Thus, it is possible to practice the invention without steps 1020 and 1030, but the presently preferred embodiment of the invention includes the steps, which constitute recurring coverage computation.

It should also be noted that, in step 960, the circuit is unrolled. Although the drawing Fig. indicates that the circuit is unrolled t times, this should not be construed to mean that the first time through the loop the circuit is unrolled one time, but the second time through the loop the circuit is unrolled two more times. In fact, the second time through the loop the circuit is unrolled a second time. Thus, when t=j, for example, the circuit has been unrolled j times in all. Likewise, the value for t begins at 1 in step 950. This could just as easily be set to 0, and the first attempt to solve the HSAT problem could be attempted on the circuit prior to any unrolling.

It should further be noted that, in the invention, when a vector is generated by solving the HSAT problem, there is no need to simulate the vector as was the case in the second observability based approach described above, and no need to modify the HDL. It will be recalled that, under the second observability based approach, the vectors were known ahead of time, but it was not known whether the vectors could propagate an error to an observable output. Nothing was known about the values of internal variables, so the HDL had to be modified and the vector had to be simulated. There is no need to simulate the vector in the present invention, because the values of the internal variables are all known. Solving the HSAT problem includes determining the values of the internal variables; solving the HSAT problem generates a vector that can propagate an error to an observable output. Once a vector is generated under the method of the invention, there is no need to simulate it to see whether it covers a tag. It is preferred to perform tag simulation, but this is not the same as vector generation, as explained above already. Likewise, in the invention, the generation of a vector does not require any modification to the HDL because, again, there is no need to simulate the vector to determine whether it provides for an observable output.

Example Application of the Basic Method

Consider the following Verilog code as an example to illustrate the above method. The code computes the running sum, sum, of the inputs in. The sum is output when two values of in$\geq$8 are observed.

```
module test (clk, in, out)
input clk;
input [3:0] in;
output out;
reg out;
reg [1:0] i;
reg [3:0] sum;
initial
    begin
        out = 0;
        i = 0;
        sum = 0;
    end
always (@ clk)
    begin
        if( in >= 8 )
            i = i + 1;
            sum = sum + in;
            if( i == 2 )
                begin
                    i = 0;
                    out = sum;
                end
            else
                out = 0;
    end
endmodule
```

Figure 11:
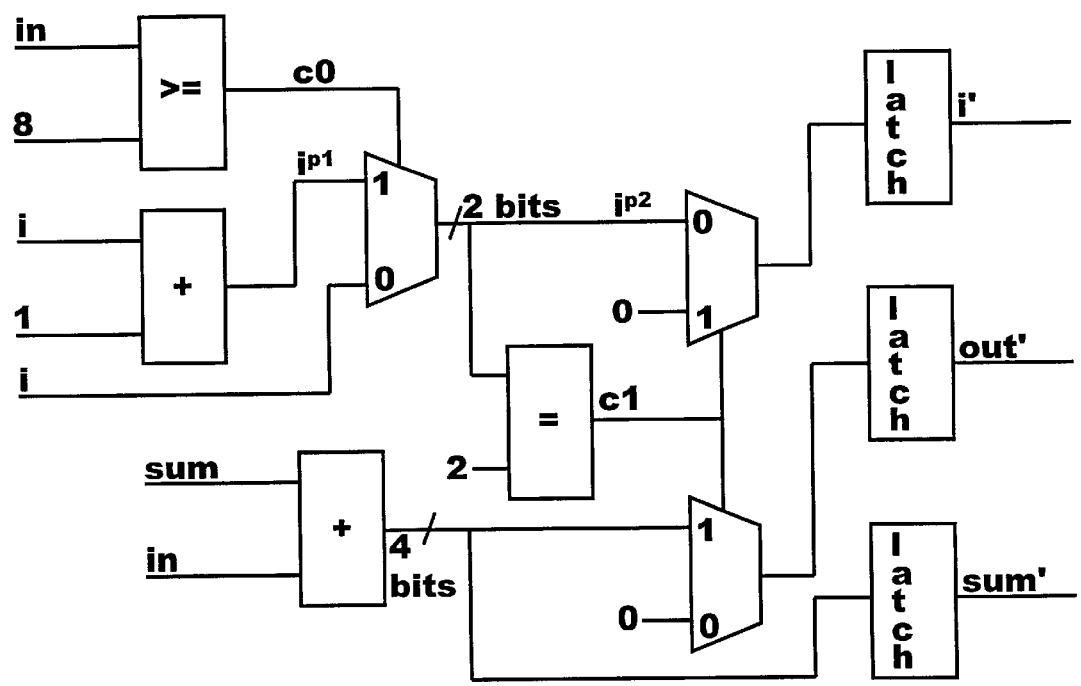
FIG. 11 shows structural RTL of a circuit used in an explanatory example relating to the invention.
Figure 12:
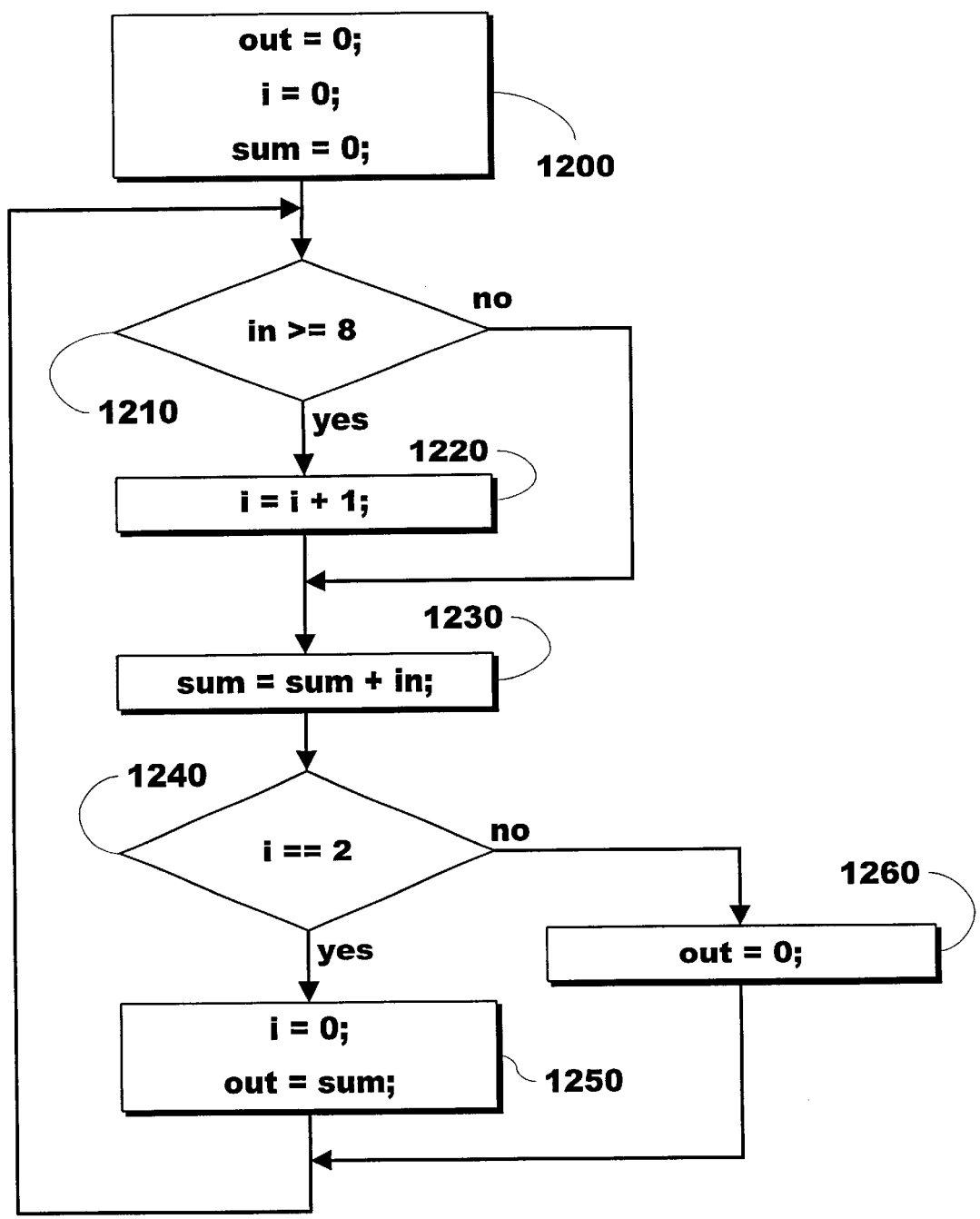
FIG. 12 shows a data flowgraph used in the explanatory example relating to the invention.

The RTL circuit 20 corresponding to this HDL code 180 is shown in FIG. 11. The corresponding data flowgraph is shown in FIG. 12. It will be appreciated that elements 1200, 1210, 1220, 1230, 1240, 1250, and 1260 correspond directly to portions of the above-identified HDL code.

Take, for example, the variable assignment sum=sum+in. Since this part of the code is an assignment, it has a corresponding tag. Assume the tag is uncovered, and that it is desired to generate a vector that covers the tag. If a vector can be found that covers the tag, this will imply that, if there is an error present at that variable assignment (i.e., sum does not equal what it is expected to equal, but has a different value represented by sum+$\Delta$), the error can be propagated to an observable output. To put another way, if a vector can be found that covers the tag, this means that the tag can be detected.

Clearly, to detect a tag on the variable assignment sum=sum+in; at least one cycle must transpire for the tag to propagate to the output out, owing to the fact that there is no output at all until two inputs greater than or equal to 8 have been provided.

The following constraints are generated for the various statements (indicated in comments below) and variables in the untagged version of one unrolling (i.e., one expansion) of the RTL circuit. The subscripts t0 and t1 indicate the time frame to which the variable belongs. The variables $i^{p1}$ and $i^{p2}$ are indicated in FIG. 11. $c1^{p1}$ and $c1^{p2}$ are temporary variables

```
//initialization
out_{t0} = 0
i_{t0} = 0
sum_{t0} = 0
// in >= 8
in_{t0} - 8 + 16(1 - c0_{t0}) ≥ 0
in_{t0} - 8 - 16c0_{t0} ≤ -1
// if/else (in >= 8)
i_{t0}^{p1} - i_{t0} = 1
i_{t0}^{p1} - i_{t0} = 1
i_{t0}^{p2} - i_{t0}^{p1} + 16(1 - c0_{t0}) ≥ 0
i_{t0}^{p2} - i_{t0}^{p1} - 16(1 - c0_{t0}) ≤ 0
i_{t0}^{p2} - i_{t0} + 16c0_{t0} ≥ 0
i_{t0}^{p2} - i_{t0} - 16c0_{t0} ≤ 0
// sum = sum + in
sum_{t1} = sum_{t0} + in_{t0}
// (i == 2)
// i >= 2
i_{t0}^{p2} - 2 + 4(1 - c1_{t0}^{p1}) ≥ 0
i_{t0}^{p2} - 2 - 4c1_{t0}^{p1} ≤ -1
// i <= 2
2 - i_{t0}^{p2} + 4(1 - c1_{t0}^{p2}) ≥ 0
2 - i_{t0}^{p2} - 4c1_{t0}^{p2} ≤ -1
// (i >= 2) && (i <= 2)
(!c1_{t0}^{p2} + !c1_{t0}^{p1} + c1_{t0})
(c1_{t0}^{p1} + !c1_{t0})
(c1_{t0}^{p2} + !c1_{t0})
// if/else (i == 2)
i_{t1} + 4(1 - c1_{t0}) ≥ 0
i_{t1} - 4(1 - c1_{t0}) ≤ 0
i_{t1} - i_{t0}^{p2} + 4c1_{t0} ≥ 0
i_{t1} - i_{t0}^{p2} - 4c1_{t0} ≤ 0
out_{t1} - sum_{t1} + 16(1 - c1_{t0}) ≥ 0
out_{t1} - sum_{t1} - 16(1 - c1_{t0}) ≤ 0
out_{t1} + 16c1_{t0} ≥ 0
out_{t1} - 16c1_{t0} ≤ 0
```

Of course, statements beginning with // are comments.

To generate a vector to cover the tag on the statement sum=sum+in;, all constraints corresponding to the operations in the fanout of sum are duplicated with each marked variable v in the constraints replaced with tagged_v. The tag is injected by means of the statement tagged_sum=sum+in+Δ; labeled with the appropriate subscripts for the number of unrollings. Constraints for detecting the tag at the output (see step 7, above, and step 990 in FIG. 9) in the first time frame are:

```
// g1 = tagged_out_{t1} > out_{t1}
tagged_out_{t1} - out_{t1} + 16(1 - g1) >= 1
// g2 = out_{t1} > tagged_out_{t1}
out_{t1} - tagged_out_{t1} + 16(1 - g2) >= 1
// g1 OR g2 = 1
g1 + g2 >= 1
```

Since the tag cannot be detected in the first time frame, the circuit must be unrolled once to generate a two time frame version. This is achieved by marking variables in the unrolled circuit, and generating constraints for the unrolled circuit. Conceptually, unrolling the circuit may be understood as follows. The circuit in FIG. 11 is duplicated, and the outputs of certain ones of three latches of the first circuit are tied to the corresponding inputs of this duplicate circuit in the appropriate places. Therefore, the output sum' of the circuit in FIG. 1 becomes the input sum of the duplicated circuit, and likewise for i'. The subscripts t0 and t1 in the duplicated constraints and in the constraints to detect the tag at the outputs are replaced by the subscripts t1 and t2, respectively. Note that Boolean and linear constraints are generated, and interact, but these are handled by the HSAT solver.

Solving these constraints, with the tag injected, provides a vector that covers at least the tag in question.

The basic vector generation method just outlined in a stepwise fashion, and just explained by way of one simple example, is just a first embodiment of the invention. In other embodiments of the invention, various heuristics are used to improve the runtime of the vector generation method, and also to improve the quality of the vectors. More than one of these heuristic approaches may be adopted, depending on the particular situation.

Figure 13:
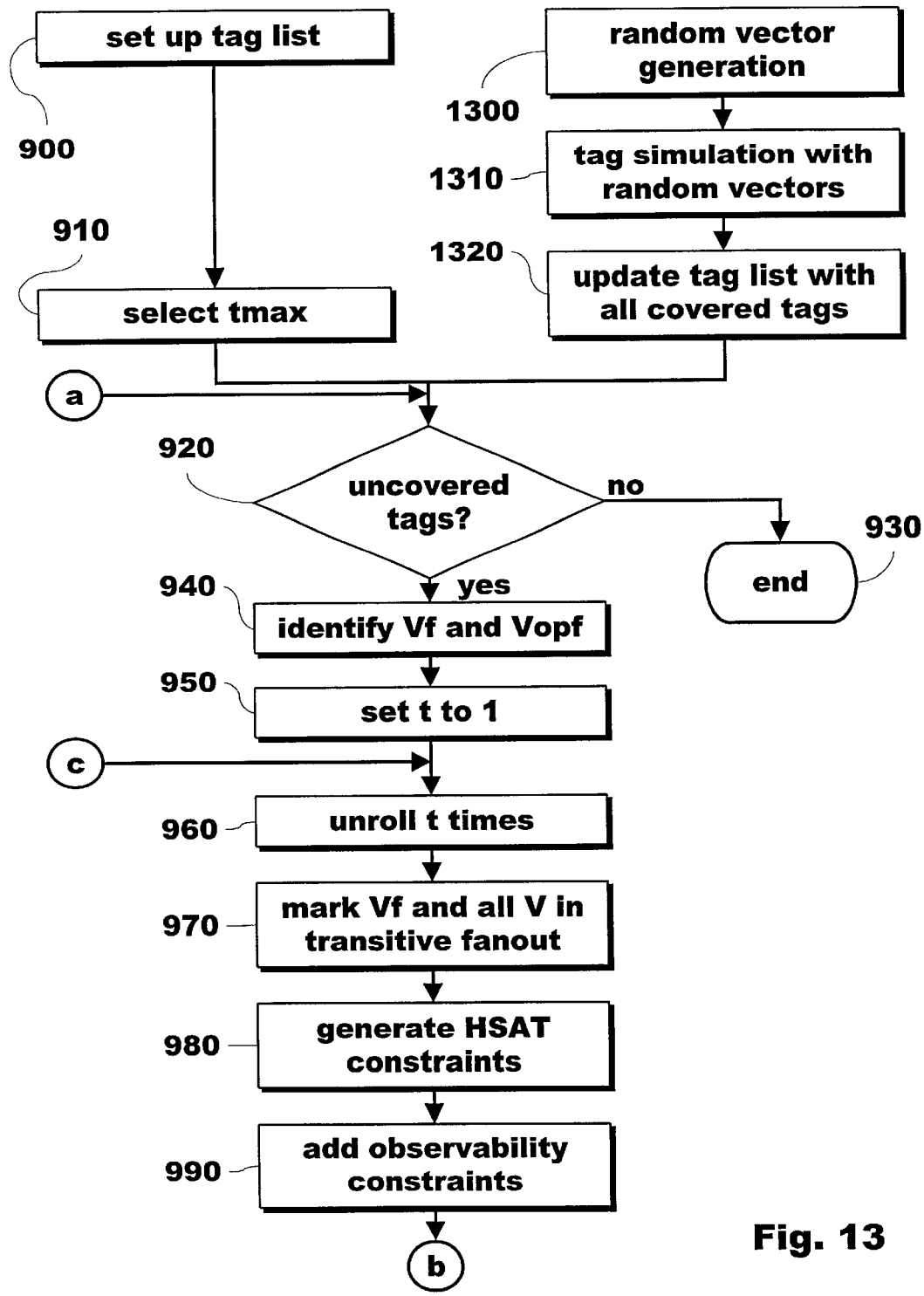
FIG. 13 shows another embodiment of the invention.

In a second embodiment of the invention, for example, the vector generation time may be reduced by preceding the basic vector generation method with a limited random vector generation phase (see FIG. 13). In particular, random vectors are generated in a step 1300. In step 1310, tag simulation is performed with the random vectors. In step 1320, the tag list is updated to reflect all the tags which are covered by the randomly generated vectors. Processing then continues as normal with step 920. Steps 900–990 and subsequent steps 1000–1060 are the same as in the first embodiment.

In a third embodiment of the invention, the size of the HSAT problem is controlled by using path selection. The smaller the HSAT problem, the shorter the runtime. In particular, in this third embodiment, constraints are generated for only a limited number of paths at a time. This controls the size of the HSAT problem that must be solved at any given time, usually leading to a smaller runtime. This is accomplished by modifying the step in the method that marks the transitive fanout variables of the tag location, namely, step 970. The markings are propagated forward only along specific paths. Constraints are added to the HSAT problem in step 980 so as to force the tag to propagate forward along only the chosen paths.

If this smaller HSAT problem is found to be infeasible, another set of paths is chosen. As a first variation on this third embodiment, preference is given to short paths when the full HSAT problem is very large. As a second variation on this third embodiment, preference is given to long paths so as to cover as many tags as possible with a fewer number of generated vectors.

In a fourth embodiment of the invention, the magnitude of the tag is maximized. It will be recalled that the tag is injected into a statement by adding its magnitude to a variable. In the above-identified example, sum was replaced by sum+Δ. The symbol Δ is the tag, and models an error. When the HSAT solver finds a vector that satisfies the given set of constraints, it is only known that the tag will propagate for the magnitude of the tag assigned by the HSAT solver. That is to say, it is not known whether the vector will propagate the tag for all possible values of the magnitude of the tag.

To increase the likelihood that real design errors will be uncovered by the generated vectors, it is best to maximize the tag magnitude for which the vector covers the tag. Ideally, a vector should be generated, if possible, that can propagate the tag independent of its magnitude. This is important because nothing about the nature of the error can be known, and no assumption of its magnitude can be made. By maximizing the magnitude of the tag in the vector, a wider range of error values can be propagated to an output using that vector.

During the search for finding a solution to the HSAT problem, the HSAT solver fixes the value of variable Δ. This means that the resulting vector will propagate the tag with some specified magnitude to the output. There is no guarantee that a tag with a different magnitude can be detected by the same vector. Consider the following Verilog code shown below.

```
x = 4;
if (X > Y)
    P = 1;
else
    P = 0;
if (Y == 8)
    P = X;
```

"Y" is an input, and "P" is an output. A vector with value 6 for Y will propagate a tag injected in the first line to the output only if the tag magnitude is greater than 2. On the other hand, if the value of Y is set to 8, a tag in the first line can be propagated to the output independent of its magnitude.

The following modifications are made to the HSAT problem in order to maximize the covered magnitude of the tag.

1. Variable substitution is used to eliminate Δ from all equality constraints.

2. For all inequality constraints with Δ present in them, these are rewritten in the following form:

Δ≦linear combination of other variables, or

Δ≧linear combination of other variables.

3. Δ is replaced by $\Delta_{ub}$ and $\Delta_{lb}$, in the first and second form inequalities, respectively, where $\Delta_{ub}$ is the upper bound of Δ, and where $\Delta_{lb}$ is the lower bound of Δ.

4. $\Delta_{ub}-\Delta_{lb}$ is maximized over the set of HSAT constraints.

The HSAT solver takes care of maximizing the value mentioned in step four. The result gives a vector which can propagate the tag for at least all values between $\Delta_{lb}$ and $\Delta_{ub}$, inclusive. By making the foregoing modifications, according to the fourth embodiment of the invention, the feasibility search problem presented to the HSAT solver in the first embodiment, is now presented as a problem of optimization over HSAT constraints.

In one variation of this fourth embodiment of the invention, a different approach to maximizing the magnitude of the covered tag is taken. In particular, this variation involves selecting the paths on the graph which propagate the tags through only operators that can propagate tags independent of their magnitude. Constraints requiring propagation through such paths are added to the HSAT problem. This way, only an HSAT feasibility problem needs to be solved. If these constraints make the HSAT problem infeasible, however, an alternative path must be tried.

Consider the example presented earlier. Assume that it is a part of a larger model and that Y is an internal signal. Since the tag on X=4 can be propagated through the statement P=X independent of the magnitude of the tag if Y has the value 8, the constraint (Y=8)=1 is added to the HSAT constraints.

In another variation of this fourth embodiment of the invention, post analysis is used. In particular, after generating the vector, the vector is analyzed to determine whether it can propagate the tag independent of its magnitude. This variation can be performed in conjunction with the other approaches to maximizing the magnitude of the tag. If the post analysis reveals that the vector cannot propagate the tag independent of the magnitude of the tag, a new vector is generated. In post analysis, the path sensitized by the generated vector for the chosen range of the tag magnitude is identified. Constraints for propagating the tag along this path are derived in a manner that will make the propagation independent of the tag magnitude, or will maximize the range of the magnitude for which the propagation is possible. The intuition is that the path is a good candidate for tag propagation and that the HSAT solver was not able to identify the input values which would make the propagation tag magnitude independent.

In a fifth embodiment of the invention, undetectable tags are avoided. To explain, it should be noted that, in some cases there might be tags in the code that cannot be detected by any vector. For example, a tag on the statement out=0 in the Verilog code in the example above, cannot be detected since the statement is basically dead code. Detecting such tags as early as possible avoids wasting time solving HSAT problems for them.

If no output variable has been marked (as in Step 5 of the basic method) in t unrollings, constraints for the tag are not generated until the t+1$^{th}$ unrolling. Furthermore, if the set of marked latches within to time frames ($t_0$<t) is equal to the set of marked variables within $t_0$+1 time frames, and no output has been marked in t time frames, the tag is undetectable. This approach is an efficient method of finding at least some of the undetectable tags, though not all of them. For example, the tag on Y on Line 2 in the following code is an undetectable tag that cannot be identified by the invention according to the fifth embodiment.

```
Line 1     if((X > 4) && (X < 3))
Line 2     Y = 1;
Line 3     P = Y
```

This tag can be determined to be undetectable by solving HSAT constraints for the tag ignoring values on latches, and writing constraints for detecting the tag on an output variable or latch. If no vector satisfying the constraints can be found, the tag is undetectable. Otherwise it might be detectable.

According to a sixth embodiment of the invention, computational time may be reduced by finding the lower bounds on the number of unrollings required for each of the tags. The minimum number of unrollings that will be required for covering a single tag may be determined by computing the number of unrollings required to obtain a marked output. It turns out that lower bounds for all tags can concurrently be computed by starting with marked outputs and propagating the markings backward to nodes in their transitive fanin. The backward propagation of the markings is continued beyond the latch boundaries by progressively increasing the number of unrollings. The number of unrollings required for a marking to reach an operation is the minimum number of unrollings that will be required to propagate a tag at that location to an output. As an extension, separate markings may be used for each output. The lower bounds for each tag are used to sort the tags according to the likely level of difficulty in covering the tag, or to determine the potential for a vector generated for a tag to cover other tags.

One reduction of the invention to practical form will now be described with reference to a prototype system produced by the inventors. The implementation uses the VL2MV Verilog parser in VIS verification system (see "VIS: A System for Verification and Synthesis"). VL2MV converts the Verilog to structural RTL in the BLIF-MV format. The implementation involved converting the BLIF-MV format to the internal graph representation from which constraints could be generated. In addition, a coverage computation (tag simulation) routine, which operated on the same graph representation, was implemented. The combination of linear and Boolean constraints was solved using the HSAT solver system (see the HSAT paper). Each time a vector was generated, it was tag-simulated to determine what other tags also were covered by it. The hardware used was a Sun Ultra 30/300 with 256 MB of RAM running at 300 MHz.

The invention, in a broad sense, ties together (1) recent developments in the computation of an observability-based coverage metric, (2) recent developments in the solution of systems of hybrid linear and Boolean constraints, and (3) novel heuristics for generating vectors for observability-enhanced coverage. A method is herein disclosed for the generation of simulation vectors from hardware description language (HDL) models, targeting observability-based statement coverage, and using a fast coverage computation procedure in the inner loop to minimize the number of vectors that need to be generated to cover all statements. The vector generation itself is done by setting up interacting linear and Boolean constraints, and solving them using hybrid linear programming and Boolean satisfiability methods. Heuristics, presented herein as different embodiments of the invention, may be used to control the size of the constraint system that needs to be solved. An important aspect of the invention is the maximization of the range of error magnitude for which a vector covers a tag. By targeting an effective coverage metric and by using deterministic vector generation, high-quality simulation vectors are automatically generated.

A design system that includes the foregoing features according to the different embodiments of the invention will be advantageous because it will allow the designer automatically to generate high-quality simulation vectors during the design process, and not just in a post-design debugging phase.

We claim:

1. A method for automatic vector generation for observability-based statement coverage for a design of a circuit, comprising:

providing a representation of said design; and automatically generating a vector sequence, based on said representation of said design, said vector sequence being generated by a computer so that every vector of the generated sequence is capable of propagating an error to an observable output defined by said design of said circuit, said vector sequence being generated by a computer.

2. The method for vector generation as set forth in claim 1, further comprising a said step of simulating errors for said representation of said design using said vector sequence, comprising:

modeling said errors as tags; and injecting said tags to determine whether perturbations in a value at a location will result in a perturbation in a value at said observable output for said generated vector sequence.

3. The method for vector generation as set forth in claim 2, wherein said generating step includes using a hybrid linear programming and Boolean satisfiability (HSAT) procedure.

4. The method for vector generation as set forth in claim 3, further comprising:

said representation of said design being HDL code and including variable assignments;

preparing a tag list, each tag corresponding to one of said variable assignments, each of said tags being initially uncovered;

selecting an uncovered tag, said selected uncovered tag defining a set of transitive fanout variables and paths among said transitive fanout variables;

marking said set of transitive fanout variables;

attempting to generate said vector sequence covering said uncovered tag by:

generating a set of constraints;

setting up an HSAT problem using said set of constraints, and finding a solution to said HSAT problem by solving said set of constraints with said HSAT procedure, said solution defining said vector sequence covering said tag; and when said vector sequence covering said tag can be generated, identifying said tag as a covered tag.

5. The method for vector generation as set forth in claim 4, further comprising, after said vector sequence is generated, performing said simulating of said vector sequence and said simulating of said errors with tag simulation using said vector sequence to detect, and to identify as covered, others of said tags covered by said vector sequence.

6. The method for vector generation as set forth in claim 4, wherein said constraints include interacting linear constraints and Boolean constraints.

7. The method for vector generation as set forth in claim 4, further comprising:

after said step of preparing a tag list, randomly generating a plurality of vector sequences;

performing said tag simulation using said plurality of randomly generated vector sequences; and identifying as covered ones of said tag list covered by said randomly generated vector sequences.

8. The method for vector generation as set forth in claim 4, further comprising:

said set of constraints being generated for only a limited number of said paths for said selected uncovered tag, thereby defining said HSAT problem as a limited HSAT problem;

attempting to solve said limited HSAT problem; and when a solution to said limited HSAT problem cannot be found, generating said set of constraints for different ones of said paths for said selected uncovered tag.

9. The method for vector generation as set forth in claim 8, further comprising selecting said limited number of said paths based on a respective length of each of said paths.

10. The method for vector generation as set forth in claim 4, further comprising maximizing a magnitude for said selected tag at which said vector sequence covers the said tag.

11. The method for vector generation as set forth in claim 10, wherein said step of maximizing said magnitude for said selected tag is performed by maximizing a difference between an upper bound and a lower bound of said tag magnitude.

12. The method for vector generation as set forth in claim 10, wherein said step of maximizing said magnitude for said selected tag is performed by adding constraints to said HSAT problem forcing propagation of said tag only through operators that can propagate said tag independent of said respective tag magnitude thereof.

13. The method for vector generation as set forth in claim 10, wherein said step of maximizing said magnitude for said selected tag is performed by making a determination, after said generation of said vector sequence, as to whether said vector sequence can propagate said selected tag independent of said respective tag magnitude, and, when said determination indicates that said vector sequence cannot propagate said selected tag independent of said respective tag magnitude, generating another vector sequence.

14. The method for vector generation as set forth in claim 4, further comprising a step of identifying ones of said tags that cannot be propagated to an observable output, and wherein said step of generating vector sequences is not performed for said identified ones of said tags.

15. The method for vector generation as set forth in claim 4, further comprising selecting ones of said tags for vector sequence generation in an order based on a respective minimum number of unrollings required for covering each said tag.

16. A computer system adapted to perform vector generation for observability-based statement coverage for a representation of a design of a circuit, comprising:

a processor, and a memory including software instructions adapted to enable the computer system to perform the steps of:
automatically generating a vector sequence, based on said representation of said design, said vector sequence being generated by a computer so that every vector of the generated sequence is capable of propagating an error to an observable output defined by said design of said circuit; and
simulating errors for said representation of said design using said vector sequence.

17. The computer system adapted to perform vector generation as set forth in claim 16, wherein said software instructions, for said step of simulating errors, include:

modeling said errors as tags; and injecting said tags to determine whether perturbations in a value at a location will result in a perturbation in a value of said observable output for said generated vector sequence.

18. The computer system adapted to perform vector generation as set forth in claim 17, wherein said software instructions, for said generating step, include using a hybrid linear programming and Boolean satisfiability (HSAT) procedure.

19. The computer system adapted to perform vector generation as set forth in claim 18, wherein said representation of said design is IIDL code including variable assignments, and wherein said software instructions further comprise:

preparing a tag list, each tag corresponding to one of said variable assignments, each of said tags being initially uncovered;

selecting an uncovered tag, said selected uncovered tag defining a set of transitive fanout variables and paths among said transitive fanout variables;

marking said set of transitive fanout variables;

attempting to generate said vector sequence covering said uncovered tag by:
generating a set of constraints;
setting up an HSAT problem using said set of constraints, and
finding a solution to said HSAT problem by solving said set of constraints with said HSAT procedure, said solution defining said vector sequence covering said tag; and
when said vector sequence covering said tag can be generated, identifying said tag as a covered tag.

20. The computer system adapted to perform vector generation as set forth in claim 19, further comprising software instructions for, after said vector sequence is generated, performing said simulating of said vector sequence and said simulating of said errors with tag simulation using said vector sequence to detect, and to identify as covered, others of said tags covered by said vector sequence.

21. The computer system adapted to perform vector generation as set forth in claim 19, wherein said constraints include interacting linear constraints and Boolean constraints.

22. The computer system adapted to perform vector generation as set forth in claim 19, further comprising software instructions for:

after said step of preparing a tag list, randomly generating a plurality of vector sequences;

performing said tag simulation using said plurality of randomly generated vector sequences; and identifying as covered ones of said tag list covered by said randomly generated vector sequences.

23. The computer system adapted to perform vector generation as set forth in claim 19, further comprising software instructions for:

said set of constraints being generated for only a limited number of said paths for said selected uncovered tag, thereby defining said HSAT problem as a limited HSAT problem;

attempting to solve said limited HSAT problem; and when a solution to said limited HSAT problem cannot be found, generating said set of constraints for different ones of said paths for said selected uncovered tag.

24. The computer system adapted to perform vector generation as set forth in claim 23, further comprising software instructions for selecting said limited number of said paths based on a respective length of each of said paths.

25. The computer system adapted to perform vector generation as set forth in claim 19, further comprising software instructions for maximizing a magnitude for said selected tag at which said vector sequence covers the said tag.

26. The computer system adapted to perform vector generation as set forth in claim 25, wherein said step of maximizing said magnitude for said selected tag is performed by maximizing a difference between an upper bound and a lower bound of said tag magnitude.

27. The computer system adapted to perform vector generation as set forth in claim 25, wherein said step of maximizing said magnitude for said selected tag is performed by adding constraints to said HSAT problem forcing propagation of said tag only through operators that can propagate said tag independent of said respective tag magnitude thereof.

28. The computer system adapted to perform vector generation as set forth in claim 25, wherein said step of maximizing said magnitude for said selected tag is performed by making a determination, after said generation of said vector sequence, as to whether said vector sequence can propagate said selected tag independent of said respective tag magnitude, and, when said determination indicates that said vector sequence cannot propagate said selected tag independent of said respective tag magnitude, generating another vector sequence.

29. The computer system adapted to perform vector generation as set forth in claim 19, further comprising software instructions for a step of identifying ones of said tags that cannot be propagated to an observable output, and wherein said step of generating vector sequences is not performed for said identified ones of said tags.

30. The computer system adapted to perform vector generation as set forth in claim 19, further comprising software instructions for selecting ones of said tags for vector sequence generation in an order based on a respective minimum number of unrollings required for covering each said tag.

31. A computer program product for enabling a computer to perform vector generation for observability-based statement coverage for a representation of a design of a circuit, comprising:

software instructions for enabling the computer to perform predetermined operations, and a computer readable medium bearing the software instructions;

the predetermined operations including the steps of:

automatically generating a vector sequence, based on said representation of said design, said vector sequence being generated by a computer so that every vector of the generated sequence is capable of propagating an error to an observable output defined by said design of said circuit; and simulating errors for said modified version of said representation.

32. The computer program product for enabling a computer to perform vector generation as set forth in claim 31, wherein said predetermined operations, for said step of simulating errors, include:

modeling said errors as tags; and injecting said tags to determine whether perturbations in a value at a location will result in a perturbation in a value of said observable output of said representation for said generated vector sequence.

33. The computer program product for enabling a computer to perform vector generation as set forth in claim 32, wherein said predetermined operations, for said generating step, include using a hybrid linear programming and Boolean satisfiability (HSAT) procedure.

34. The computer program product for enabling a computer to perform vector generation as set forth in claim 33, wherein said representation of said design is HDL code and includes variable assignments, and wherein said predetermined operations further comprise:

preparing a tag list, each tag corresponding to one of said variable assignments, each of said tags being initially uncovered;

selecting an uncovered tag, said selected uncovered tag defining a set of transitive fanout variables and paths among said transitive fanout variables;

marking said set of transitive fanout variables;

attempting to generate said vector sequence covering said uncovered tag by:

generating a set of constraints;

setting up an HSAT problem using said set of constraints, and finding a solution to said HSAT problem by solving said set of constraints with said HSAT procedure, said solution defining said vector sequence covering said tag; and when said vector sequence covering said tag can he generated, identifying said tag as a covered tag.

35. The computer program product for enabling a computer to perform vector generation as set forth in claim 34, wherein said predetermined operations include, after said vector sequence is generated, performing said simulating of said vector sequence and said simulating of said errors with tag simulation using said vector sequence to detect, and to identify as covered, others of said tags covered by said vector sequence.

36. The computer program product for enabling a computer to perform vector generation as set forth in claim 34, wherein said constraints include interacting linear constraints and Boolean constraints.

37. The computer program product for enabling a computer to perform vector generation as set forth in claim 34, wherein said predetermined operations include:

after said step of preparing a tag list, randomly generating a plurality of vector sequences;

performing said tag simulation using said plurality of randomly generated vector sequences; and identifying as covered ones of said tag list covered by said randomly generated vector sequences.

38. The computer program product for enabling a computer to perform vector generation as set forth in claim 34, wherein said predetermined operations include:

said set of constraints being generated for only a limited number of said paths for said selected uncovered tag, thereby defining said HSAT problem as a limited HSAT problem;

attempting to solve said limited HSAT problem; and when a solution to said limited HSAT problem cannot be found, generating said set of constraints for different ones of said paths for said selected uncovered tag.

39. The computer program product for enabling a computer to perform vector generation as set forth in claim 38, wherein said predetermined operations include selecting said limited number of said paths based on a respective length of each of said paths.

40. The computer program product for enabling a computer to perform vector generation as set forth in claim 34, wherein said predetermined operations include maximizing a magnitude for said selected tag at which said vector sequence covers the said tag.

41. The computer program product for enabling a computer to perform vector generation as set forth in claim 40, wherein said step of maximizing said magnitude for said selected tag is performed by maximizing a difference between an upper bound and a lower bound of said tag magnitude.

42. The computer program product for enabling a computer to perform vector generation as set forth in claim 40, wherein said step of maximizing said magnitude for said selected tag is performed by adding constraints to said HSAT problem forcing propagation of said tag only through operators that can propagate said tag independent of said respective tag magnitude thereof.

43. The computer program product for enabling a computer to perform vector generation as set forth in claim 40, wherein said step of maximizing said magnitude for said selected tag is performed by making a determination, after said generation of said vector sequence, as to whether said vector sequence can propagate said selected tag independent of said respective tag magnitude, and, when said determination indicates that said vector sequence cannot propagate said selected tag independent of said respective tag magnitude, generating another vector sequence.

44. The computer program product for enabling a computer to perform vector generation as set forth in claim 34, wherein said predetermined operations include a step of identifying ones of said tags that cannot be propagated to an observable output, and wherein said step of generating vector sequences is not performed for said identified ones of said tags.

45. The computer program product for enabling a computer to perform vector generation as set forth in claim 34, wherein said predetermined operations include selecting ones of said tags for vector sequence generation in an order based on a respective minimum number of unrollings required for covering each said tag.

* * * * *